United States Patent
Rastogi et al.

(10) Patent No.: US 10,474,783 B2
(45) Date of Patent: Nov. 12, 2019

(54) SEMICONDUCTOR DEVICE, METHOD OF DESIGNING A LAYOUT OF A SEMICONDUCTOR DEVICE, AND METHOD OF MANUFACTURING A SEMICONDUCTOR DEVICE

(71) Applicant: SAMSUNG ELECTRONICS CO., LTD., Suwon-si, Gyeonggi-do (KR)

(72) Inventors: Sidharth Rastogi, Hwaseong-si (KR); Subhash Kuchanuri, Hwaseong-si (KR); Chul-Hong Park, Seongnam-si (KR); Jae-Seok Yang, Hwaseong-si (KR)

(73) Assignee: SAMSUNG ELECTRONICS CO., LTD., Suwon-si, Gyeonggi-do (KR)

( * ) Notice: Subject to any disclaimer, the term of this patent is extended or adjusted under 35 U.S.C. 154(b) by 51 days.

(21) Appl. No.: 15/701,971

(22) Filed: Sep. 12, 2017

(65) Prior Publication Data

US 2018/0157781 A1 Jun. 7, 2018

(30) Foreign Application Priority Data

Dec. 6, 2016 (KR) .......... 10-2016-0165117

(51) Int. Cl.
*G06F 17/50* (2006.01)
*H01L 21/768* (2006.01)
(Continued)

(52) U.S. Cl.
CPC ...... *G06F 17/5072* (2013.01); *G06F 17/5077* (2013.01); *H01L 21/76838* (2013.01); *H01L 23/5226* (2013.01); *H01L 27/0207* (2013.01); *H01L 27/11807* (2013.01); *H01L 2027/11875* (2013.01)

(58) Field of Classification Search
CPC ............ G06F 17/5072; G06F 17/5077; H01L 27/0207; H01L 23/5226; H01L 21/76838; H01L 27/11807; H01L 2027/11875
See application file for complete search history.

(56) References Cited

U.S. PATENT DOCUMENTS 5,420,800 A * 5/1995 Fukui ................. G06F 17/5068
716/122
7,919,792 B2 4/2011 Law et al.
(Continued)

FOREIGN PATENT DOCUMENTS

| JP | 2009-076501 A | 4/2009 |
| KR | 10-2012-0127252 A | 11/2012 |
| KR | 10-1532858 B1 | 6/2015 |

*Primary Examiner* — John P. Dulka
(74) *Attorney, Agent, or Firm* — Lee & Morse, P.C.

(57) ABSTRACT

A method of designing a layout of a semiconductor device includes designing layouts of cells, each layout including first conductive lines, the first conductive lines extending in a first direction and being spaced apart from each other in a second direction crossing the first direction, disposing the layouts of the cells to be adjacent to each other in the first direction, such that the first conductive lines in adjacent layouts of the cells are connected to each other, and disposing insulation blocks at a boundary area between adjacent ones of the layouts of the cells or in areas of the layouts of the cells adjacent to the boundary area, such that the insulation blocks block connections between some of the first conductive lines.

20 Claims, 39 Drawing Sheets

(51) Int. Cl.
*H01L 23/522* (2006.01)
*H01L 27/02* (2006.01)
*H01L 27/118* (2006.01)

(56) References Cited

U.S. PATENT DOCUMENTS

| | | | | |
|---|---|---|---|---|
| 8,451,026 | B2* | 5/2013 | Biggs | H01L 27/0207 |
| | | | | 326/101 |
| 8,513,978 | B2 | 8/2013 | Sherlekar | |
| 8,756,550 | B2* | 6/2014 | Blatchford | H01L 27/11807 |
| | | | | 430/30 |
| 9,252,763 | B2* | 2/2016 | Ogata | H01L 27/0207 |
| 9,269,702 | B2* | 2/2016 | Quandt | H01L 27/0207 |
| 9,793,240 | B2* | 10/2017 | Leung | H01L 23/4952 |
| 2009/0286358 | A1* | 11/2009 | Yang | H01L 27/0207 |
| | | | | 438/121 |
| 2015/0333008 | A1* | 11/2015 | Gupta | H01L 27/0207 |
| | | | | 257/369 |
| 2016/0063166 | A1* | 3/2016 | Hsieh | G06F 17/5072 |
| | | | | 257/774 |

* cited by examiner

SEMICONDUCTOR DEVICE, METHOD OF DESIGNING A LAYOUT OF A SEMICONDUCTOR DEVICE, AND METHOD OF MANUFACTURING A SEMICONDUCTOR DEVICE

CROSS-REFERENCE TO RELATED APPLICATION

Korean Patent Application No. 10-2016-0165117, filed on Dec. 6, 2016, in the Korean Intellectual Property Office, and entitled: "Semiconductor Device, Method of Designing a Layout of a Semiconductor Device, and Method of Manufacturing a Semiconductor Device," is incorporated by reference herein in its entirety.

BACKGROUND

1. Field

Example embodiments relate to a semiconductor device, a method of designing a layout of a semiconductor device, and a method of manufacturing a semiconductor device. More particularly, example embodiments relate to a semiconductor device including a wiring structure, a method of designing a layout of a semiconductor device including a wiring structure, and a method of manufacturing a semiconductor device including a wiring structure.

2. Description of the Related Art

In order to form an insulation block for blocking electrical connections to wirings, e.g., that may be used for applying electrical signals to cells, each one of wirings extending in a first direction and being disposed in a second direction may be cut using a mask having an opening extending in the second direction. However, an insulation block corresponding to an end portion of the opening in the second direction may not have the same shape as that of an insulation block corresponding to a central portion of the opening.

SUMMARY

According to example embodiments, there is provided a method of designing a layout of a semiconductor device. In the method, layouts of cells each including first conductive lines may be designed. Each of the first conductive lines may extend in a first direction, and the first conductive lines may be disposed in a second direction crossing the first direction. The cells may be disposed to be adjacent to each other in the first direction so that the first conductive lines may be connected to each other. Insulation blocks may be disposed at a boundary area between the cells or in areas of the cells adjacent the boundary area, and may be configured to block connections between the first conductive lines.

According to other example embodiments, there is provided a method of designing a layout of a semiconductor device. In the method, cells may be disposed in a first direction so that first conductive lines in the respective cells may be connected with each other. The first conductive lines may be disposed in a second direction substantially perpendicular to the first direction in each of the cells, and each of the first conductive lines may extend in the first direction. Insulation blocks may be disposed at a boundary area between the cells or in areas of the cells adjacent the boundary area to partially overlap each of the first conductive lines. Second conductive lines may be disposed in the first direction in each of the cells, and each of the second conductive lines may extend in the second direction. First vias may be disposed so that each of the first vias may commonly overlap one of the first conductive lines and one of the second conductive lines in a plan view.

According to yet other example embodiments, there is provided a method of manufacturing a semiconductor device. In the method, first conductive lines may be formed in a second direction on a substrate including cell regions. Each of the first conductive lines may extend in a first direction crossing the second direction. Insulation blocks may be formed at a boundary area between the cell regions in the first direction areas of the cell regions adjacent the boundary area. Portions of the first conductive may be replaced by the insulating blocks, respectively. Second conductive lines may be formed in the first direction, and each of the second conductive lines may extend in the second direction on the first conductive lines in each of the cell regions and may be electrically connected to each of the first conductive lines through underlying first vias.

According to still other example embodiments, there is provided a semiconductor device. The semiconductor device may include first conductive lines, insulation blocks, and second conductive lines. The first conductive lines may be formed on a substrate including cell regions. Each of the first conductive lines may extend in a first direction, and the first conductive lines may be disposed in a second direction crossing the first direction. The insulation blocks may be formed at a boundary area at which the cell regions contact each other in the first direction or in areas of the cell regions adjacent the boundary area, and the insulation blocks may cut the first conductive lines, respectively. The second conductive lines may be formed in the first direction, and each of the second conductive lines may extend in the second direction on the first conductive lines in each of the cell regions and may be electrically connected to each of the first conductive lines through underlying first vias.

According to yet other example embodiments, there is provided a semiconductor device. The semiconductor device may include first conductive lines, insulation and second conductive lines. The first conductive lines may be formed on a substrate including first and second cell regions adjacent to each other in a first direction. Each of the first conductive lines may extend in the first direction, and the first conductive lines may be disposed in a second direction crossing the first direction. The insulation blocks may be formed at a boundary area at which the first and second cell regions contact other in the first direction or in areas of the first and second cell regions adjacent the boundary area, and the insulation blocks may cut the first conductive lines, respectively. The second conductive lines may be formed in the first direction, and each of the conductive lines may extend in the second direction on the first conductive lines in each of the first and second cell regions and may be electrically connected to each of the first conductive lines through underlying vias. At least one of the second conductive lines in the second cell region may be electrically connected to a portion of one of the first conductive lines in the first cell region through one of the vias.

According to still other example embodiments, there is provided a method of designing a layout of a semiconductor device, the method including designing layouts of cells, each layout including first conductive lines, the first conductive lines extending in a first direction and being spaced apart from each other in a second direction crossing the first direction, disposing the layouts of the cells to be adjacent to each other in the first direction, such that the first conductive lines in adjacent layouts of the cells are connected to each other, and disposing insulation blocks at a boundary area between adjacent ones of the layouts of the cells or in areas of the layouts of the cells adjacent to the boundary area, such that each insulation block of the insulation blocks divides a corresponding one of the first conductive lines into two separate portions.

BRIEF DESCRIPTION OF THE DRAWINGS

Features will become apparent to those of ordinary skill in the art by describing in detail exemplary embodiments with reference to the attached drawings, in which.

DETAILED DESCRIPTION

FIGS. 1 to 10 are plan views illustrating methods of designing a layout of a semiconductor device in accordance with example embodiments.

Figure 1:
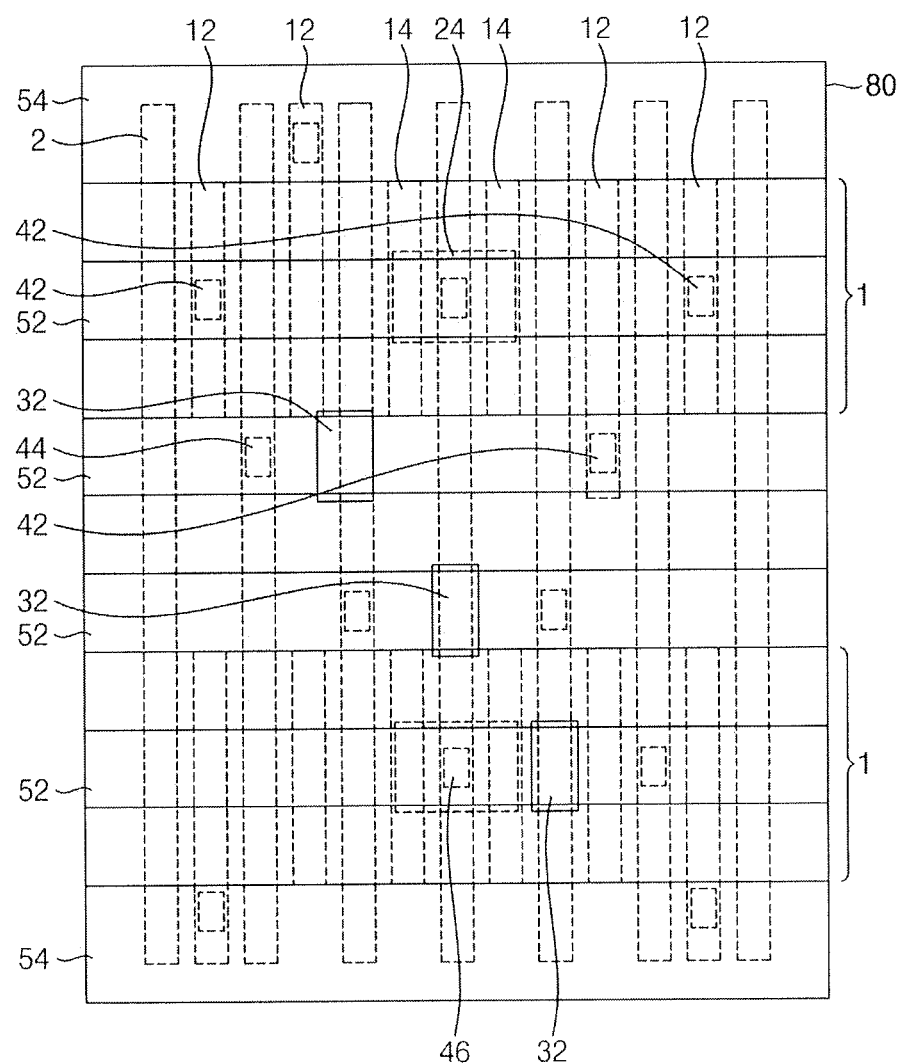
FIGS. 1 to 10 illustrate plan views of methods of designing a layout of a semiconductor device in accordance with example embodiments.

Referring to FIG. 1, a first mask 80 including layouts of elements in each cell of a semiconductor device may be designed. FIG. 1 shows, for convenience of explanation, that the layouts of the elements in each cell are designed by one first mask 80. However, embodiments are not limited thereto. That is, a plurality of masks vertically overlapping with each other, e.g., on top of each other, may be used for designing the layouts of the elements according to the levels at which they are actually formed.

The cell and the elements shown in FIG. 1 are non-limitingly illustrative, and embodiments are not limited thereto. That is, layouts of various types of cells including various types of elements may be designed.

As illustrated in FIG. 1, the first mask 80 may include a source/drain layer 1, a gate line 2, first and second contact plugs 12 and 14, a third contact plug 24, a first insulation block 32, first to third vias 42, 44 and 46, and first and second conductive lines 52 and 54.

The source/drain layer 1 may extend in a first direction, and a plurality of source/drain layers 1 may be arranged, e.g., spaced apart from each other, in a second direction crossing the first direction. In example embodiments, the first and second directions may be substantially perpendicular to each other.

The gate line 2 may extend in the second direction to at least partially overlap the source/drain layer 1. A plurality of the gate lines 2 may be arranged, e.g., spaced apart from each other, in the first direction.

The first and second contact plugs 12 and 14 may extend in the second direction, e.g., parallel to the gate lines 2. Each of the first and second contact plugs 12 and 14 may at least partially overlap the source/drain layer 1 between the, e.g., adjacent, gate lines 2. For example, as illustrated in FIG. 1, each of the first and second contact plugs 12 and 14 may be positioned in a space between two adjacent gate lines 2 without overlapping the gate lines 2, and e.g., a length of the first and second contact plugs 12 and 14 may be different from each other in the second direction.

For example, as illustrated in FIG. 1, the third contact plug 24 may have a different shape than the first and second contact plugs 12 and 14. For example, the third contact plug 24 may at least partially overlap two neighboring second contact plugs 14 in the first direction and one gate line 2 therebetween.

Each of the first and second conductive lines 52 and 54 may extend in the first direction. The first conductive line 52 may overlap a central portion of each of the gate lines 2, and a plurality of first conductive lines 52 may be arranged in the second direction to be spaced apart from each other. Each of the second conductive lines 54 may overlap each of opposite ends of each of the gate lines 2, and the second conductive lines 54 may be spaced apart from each other in the second direction. For example, as illustrated in FIG. 1, the plurality of first conductive lines 52 may be arranged between two second conductive lines 54, all spaced apart from each other along the second direction.

As illustrated in FIG. 1, the first insulation block 32 may overlap the first conductive line 52. Thus, the first conductive line 52 with the first insulation block 32 may be divided into two pieces, e.g., portions, spaced apart from each other in the first direction.

The first via 42 may commonly overlap the first contact plug 12 and the first conductive line 52, or commonly overlap the first contact plug 12 and the second conductive line 54. The second via 44 may commonly overlap the gate line 2 and the first conductive line 52, or commonly overlap the gate line 2 and the second conductive line 54. The third via 46 may commonly overlap the gate line 2, the third contact plug 24, and the first conductive line 52.

Figure 2:
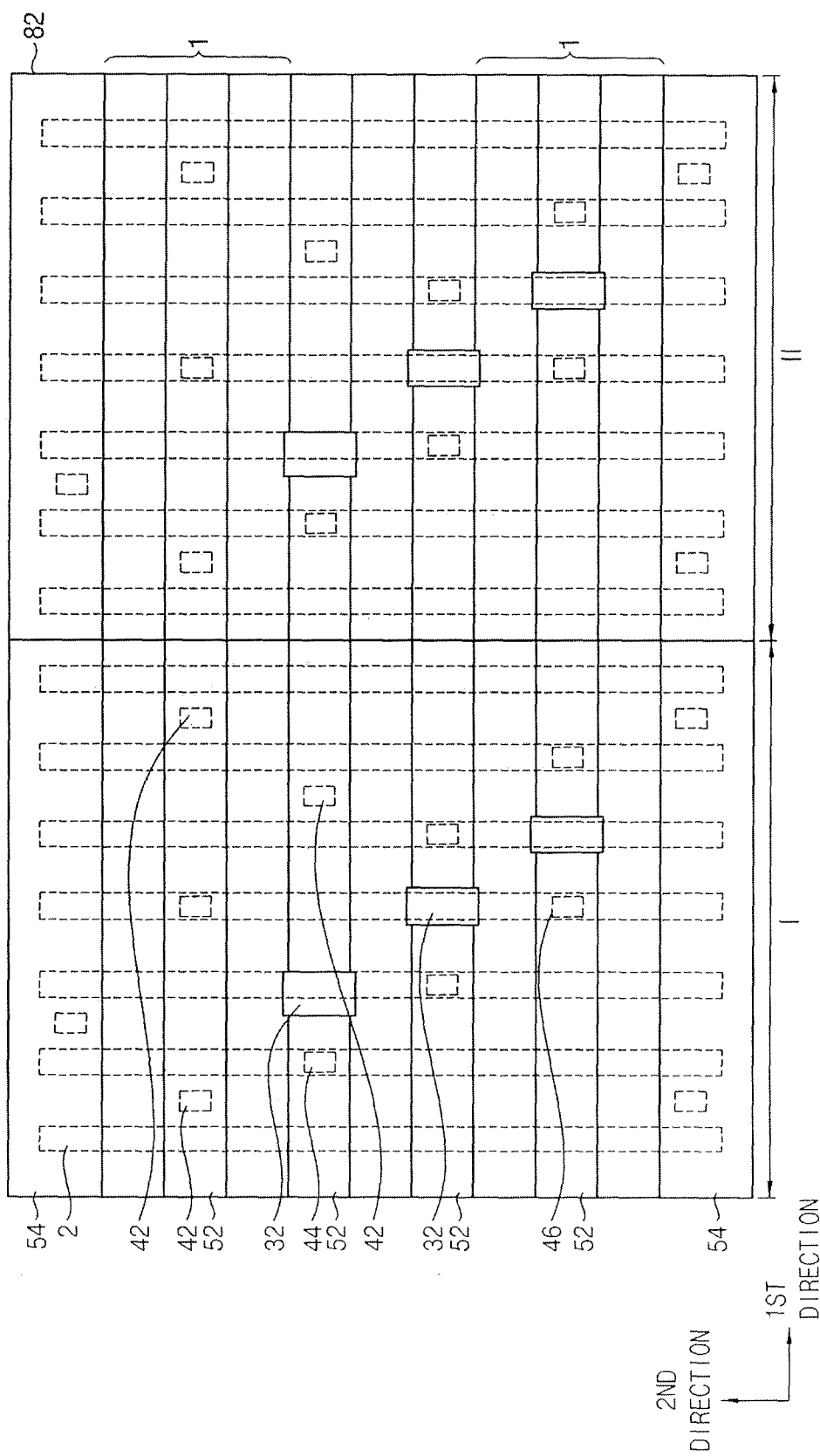

Referring to FIG. 2, a second mask 82 having a layout of an entire cell structure including a plurality of cells designed by the first mask 80 may be designed. For example, the second mask 82 may have a layout including a plurality of cells, e.g., two cells, having the layout of the first mask 80. For example, the layout of the second mask 82 is arranged such that the plurality of cells, e.g., two cells having the layout of the first mask 80, are arranged to be adjacent to each other in the first direction with the first and second conductive lines 52 and 54 in the adjacent layouts being, e.g., electrically, connected to, e.g., collinear with, each other across a boundary line between the adjacent cells.

FIG. 2 shows, for convenience of explanation, a portion of the second mask 82, i.e., layouts of first and second cells adjacent to each other in the first direction. However, embodiments are not limited thereto. That is, the second mask 82 may include layouts of the entire cell structure including a plurality of cells, e.g., more than two cells, arranged in the first and second directions. For convenience of explanation only, contact plugs are not illustrated in FIG. 2.

Hereinafter, in the second mask 82, a first cell region may be indicated by "I," and a second cell region may be indicated by "II." Same elements within the cells are designated with same reference numerals throughout the specification.

Figure 3:
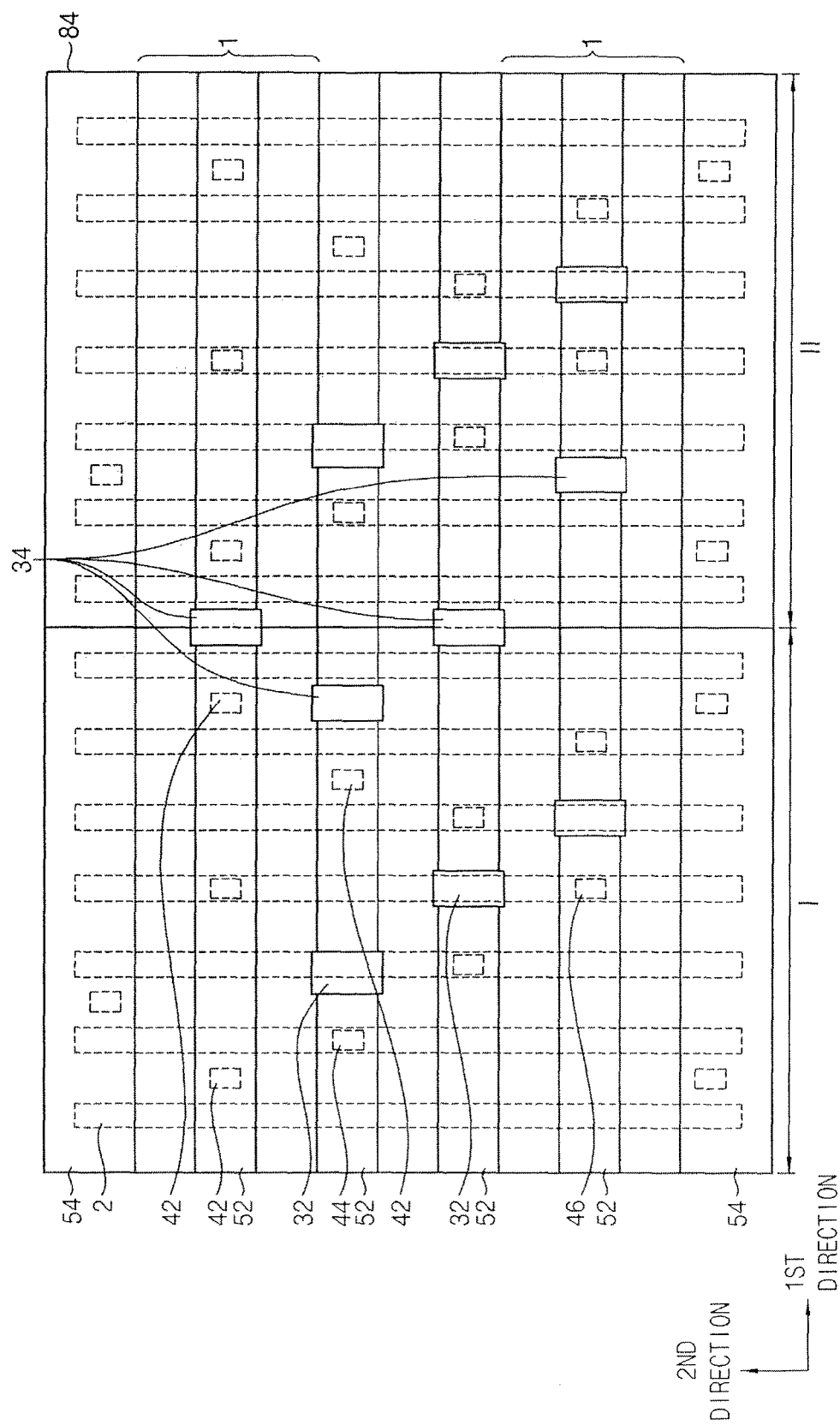

Referring to FIG. 3, a third mask 84 including a layout of a second insulation block 34 may be designed. For example, the third mask 84 may be aligned above the second mask 82 with the second insulation block 34 therein.

In detail, the second insulation block 34 may be arranged at a boundary area between the first and second regions I and II of adjacent cells, or in an area of each of the first and second regions I and II adjacent to the boundary area. Thus, the first conductive line 52 may be divided into, e.g., two, portions by the second insulation block 34, e.g., in addition to being divided by the first insulation block 32. In example embodiments, the second insulation block 34 may have a length in the second direction equal to or greater than a width of the first conductive line 52 in the second direction so that the first conductive line 52 may be completely divided by the second insulation block 34, e.g., portions of the first conductive line 52 may be completely separated from each other in the first direction by the second insulation block 34. For example, as illustrated in FIG. 3, a length of each second insulation block 34 in the second direction may be smaller than a combined width of two adjacent first conductive lines 52 in the second direction.

In example embodiments, the second insulation block 34 may be arranged between neighboring ones of the gate lines 2 in the first direction. In example embodiments, a plurality of second insulation blocks 34 may be arranged to be spaced apart from each other. That is, the second insulation blocks 34 overlapping the first conductive lines 52, respectively, arranged in the second direction may not contact each other in the second direction. At least one of the second insulation blocks 34 may be arranged not at the boundary area but in the area of each of the first and second regions I and II adjacent the boundary area.

In example embodiments, neighboring ones of the second insulation blocks 34 may not be arranged in the second direction in parallel, e.g., neighboring ones of the second insulation blocks 34 may not be arranged on a same first conductive lines 52 but rather on adjacent first conductive lines 52. That is, neighboring ones of the second insulation blocks 34 may not overlap each other in the second direction. For example, as illustrated in FIG. 3, adjacent ones of the second insulation blocks 34 may be spaced apart from each other diagonally, e.g., along the first and second directions, to define a zigzag pattern.

The neighboring ones of the second insulation blocks 34 may not be arranged in the second direction in parallel and may be spaced apart from each other, e.g., in a zigzag pattern as described above. Thus, during an actual manufacturing process for forming the second insulation blocks 34 on a substrate, e.g., when using the third mask 84, formation of the second insulation blocks 34 may be easily performed without the effect of neighboring second insulation blocks 34 on each other.

For example, as illustrated in FIG. 3, the second insulation blocks 34 may have substantially the same size and shape. Thus, each portion of the first conductive line 52 divided by the second insulation blocks 34 may have substantially the same shape regardless of positions of the second insulation blocks 34.

Figure 8:
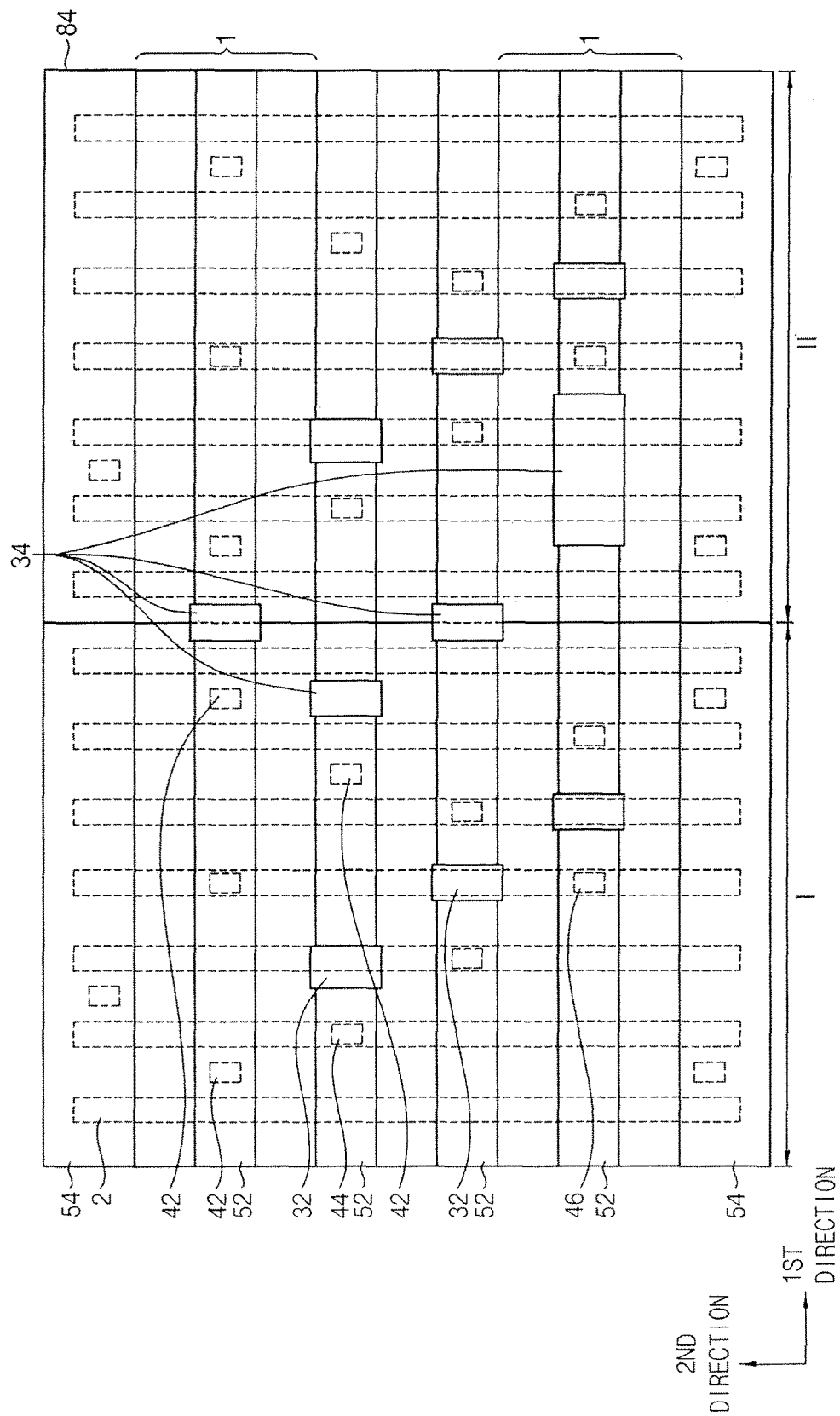

In another example, referring to FIG. 8, at least one of the second insulation blocks 34 may have a length in the first direction different, e.g., longer, from those of other ones of the second insulation blocks 34. For example, one of the first conductive lines 52 overlapped by the at least one longer second insulation blocks 34 may be cut by a longer length through the at least one longer second insulation blocks 34 when the first conductive lines 52 are actually formed on the substrate. Thus, an RC-delay of electrical signals flowing through the one of the first conductive lines 52 may be reduced.

For example, when a distance between a first one of the first to third vias 42, 44 and 46 in an area of the first region I adjacent the boundary area and a second one of the first to third vias 42, 44 and 46 in an area of the second region II adjacent the boundary area is equal to or less than a given distance, the second insulation block 34 between the first and second ones may be arranged at the boundary area (e.g., top second insulation block 34 in FIG. 3). In another example, when a distance between a first one of the first to third vias 42, 44 and 46 in an area of the first region I adjacent the boundary area and a second one of the first to third vias 42, 44 and 46 in an area of the second region II adjacent the boundary area is more than the given distance, the second insulation block 34 between the first and second ones may be arranged in an area of the first region I or the second region II adjacent the boundary area (e.g., second top second insulation block 34 in FIG. 3). In example embodiments, the given distance may be twice a distance between neighboring ones of the gate lines 2 arranged in the first direction.

Figure 4:
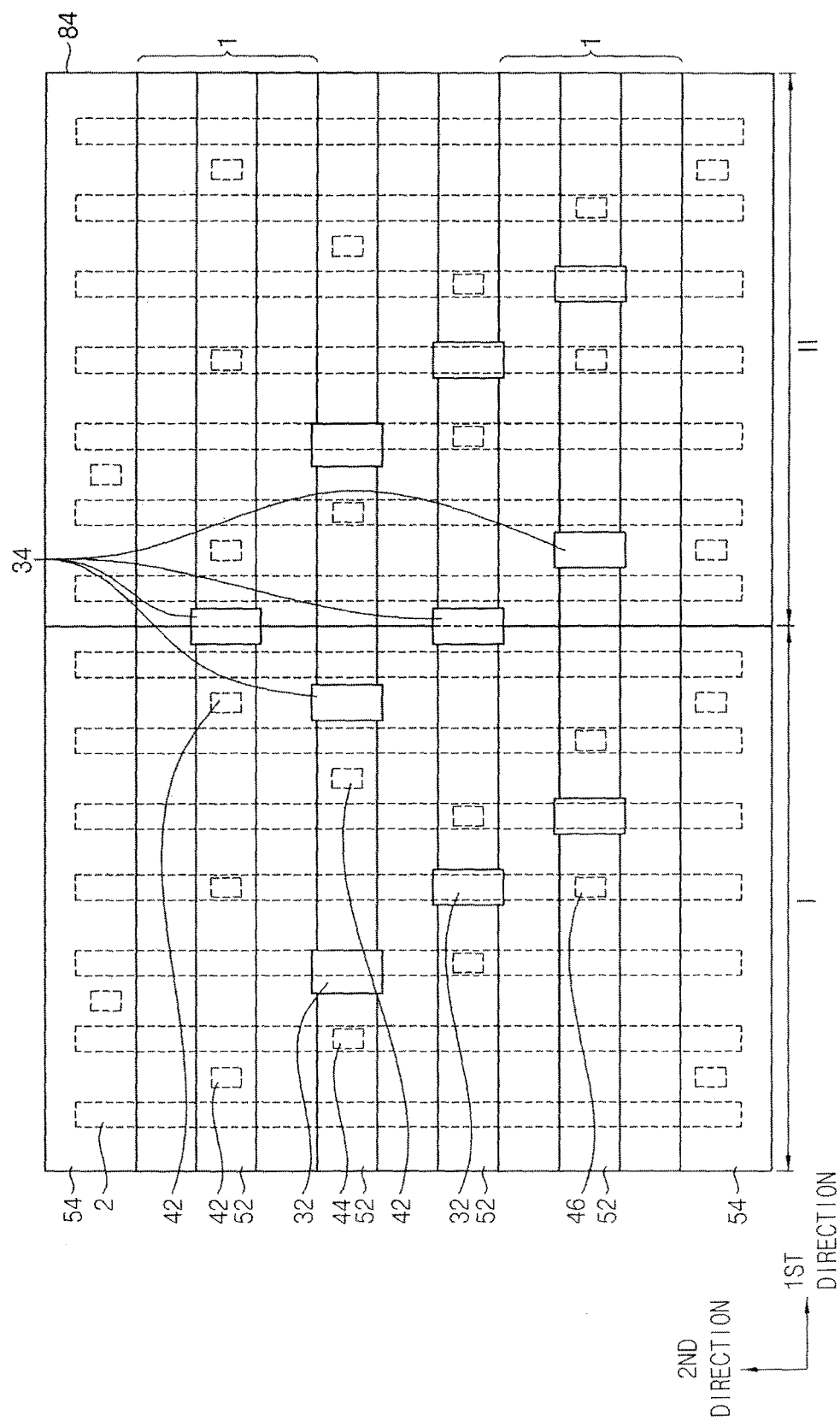
Figure 5:
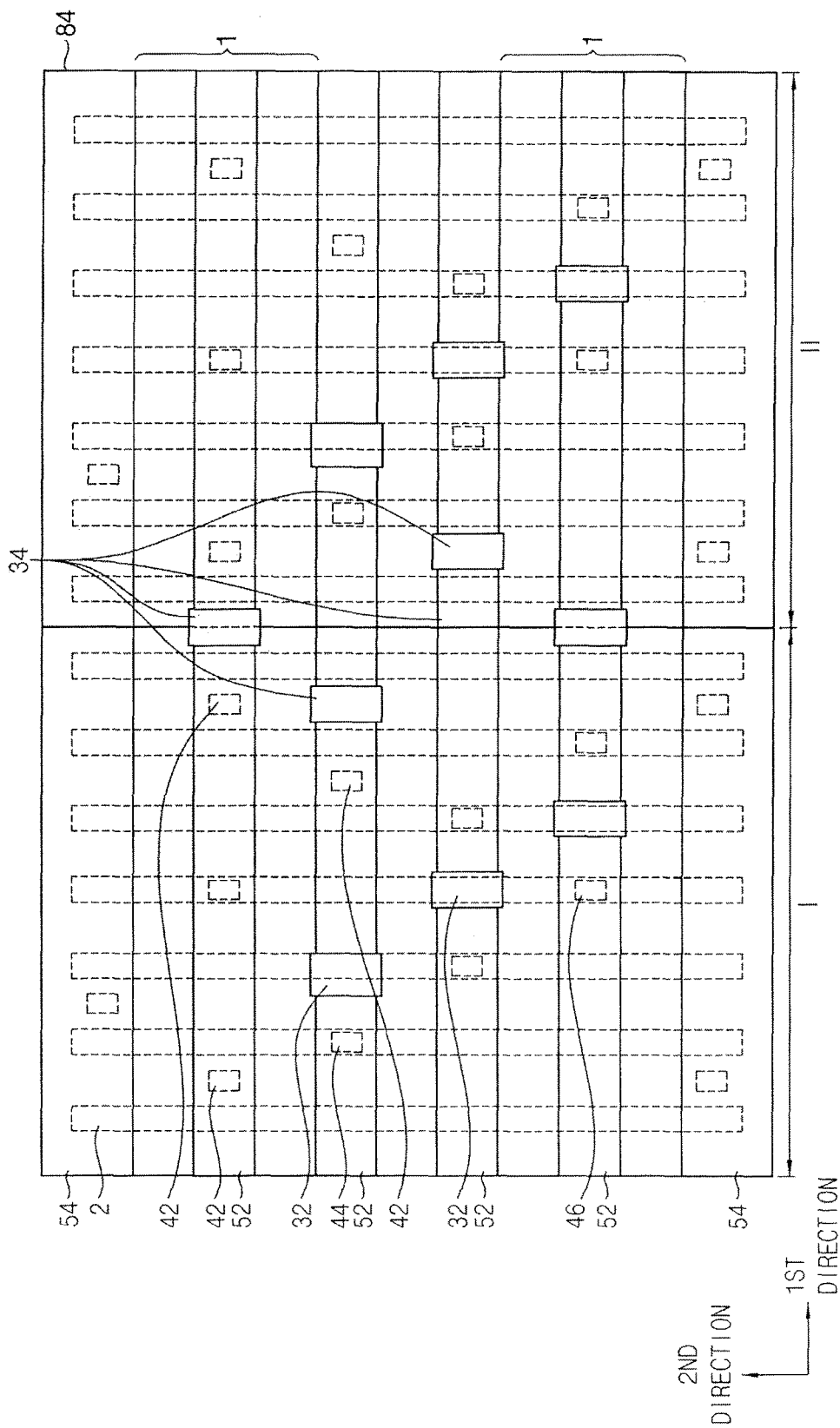
Figure 6:
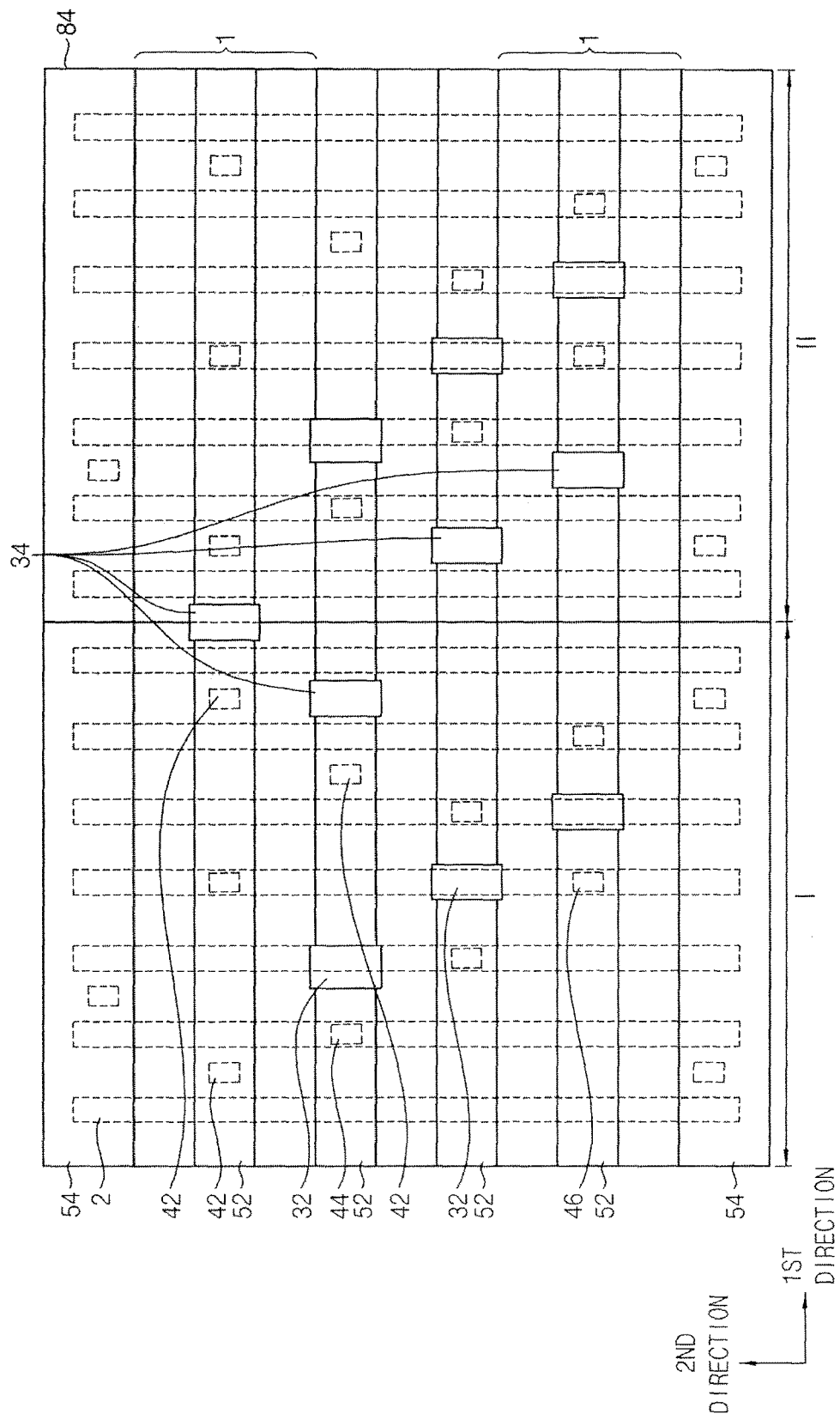

FIGS. 3 to 6 show different arrangements of the second insulation blocks 34 according to the above descriptions. That is, FIGS. 3 to 5 show that two second insulation blocks 34 may be arranged at the boundary area between the first and second regions I and II, and other two second insulation blocks 34 may be arranged in areas of the first and second regions I and II. FIG. 6 shows that one second insulation block 34 may be arranged at the boundary area between the first and second regions I and II, and other three second insulation blocks 34 may be arranged in areas of the first and second regions I and II, respectively.

Figure 7:
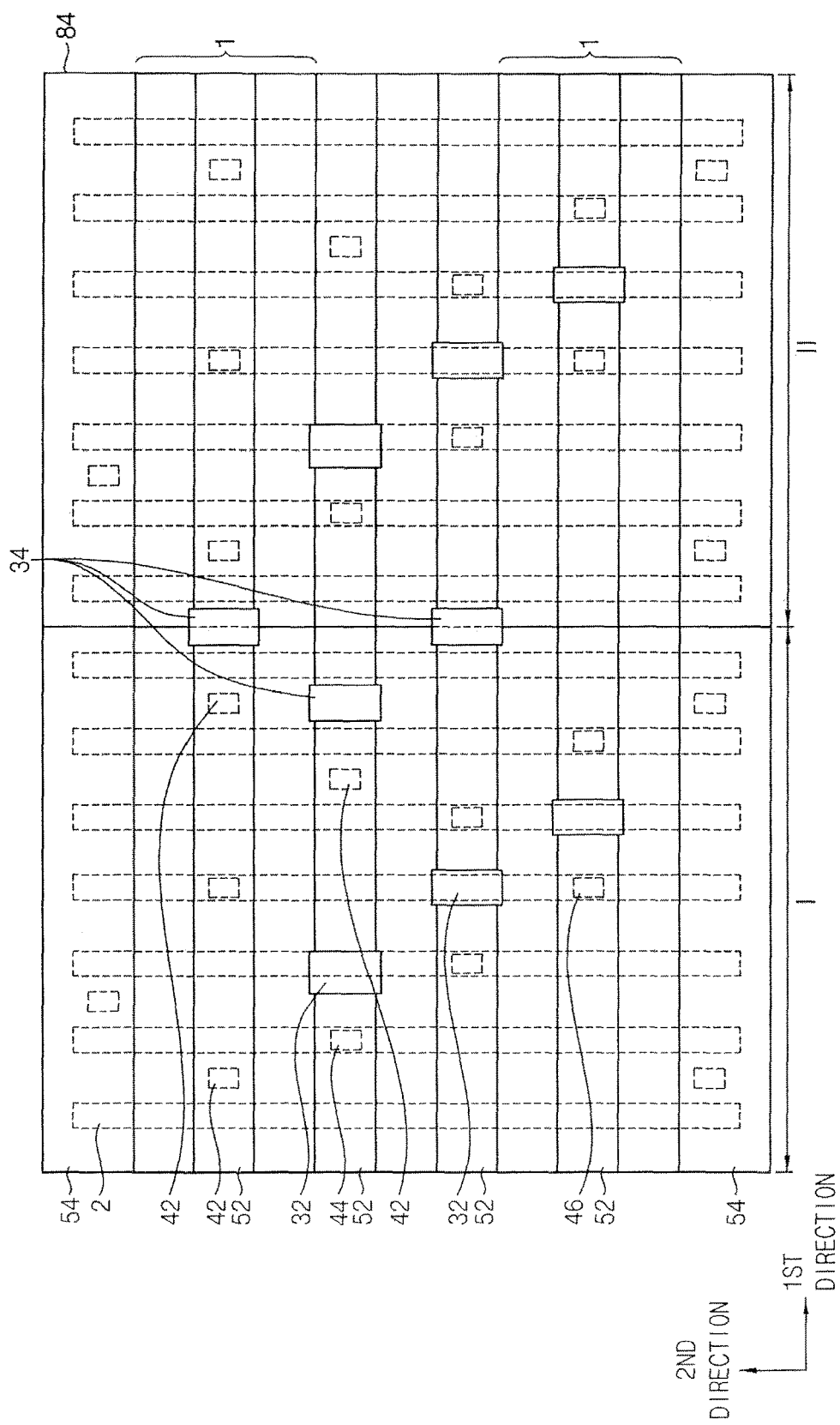

FIG. 7, unlike FIGS. 3 to 6, shows that only three second insulation blocks 34 overlap three first conductive lines 52, respectively, and no second insulation block is arranged on the first conductive line 52. That is, in some embodiments, no second insulation block may be arranged on a specific first conductive line 52. In this case, when the first conductive line 52 is actually formed on the substrate, the same signal may be applied to portions of the first conductive line 52 in the first and second regions I and II, without other intermediate elements.

Figure 9:
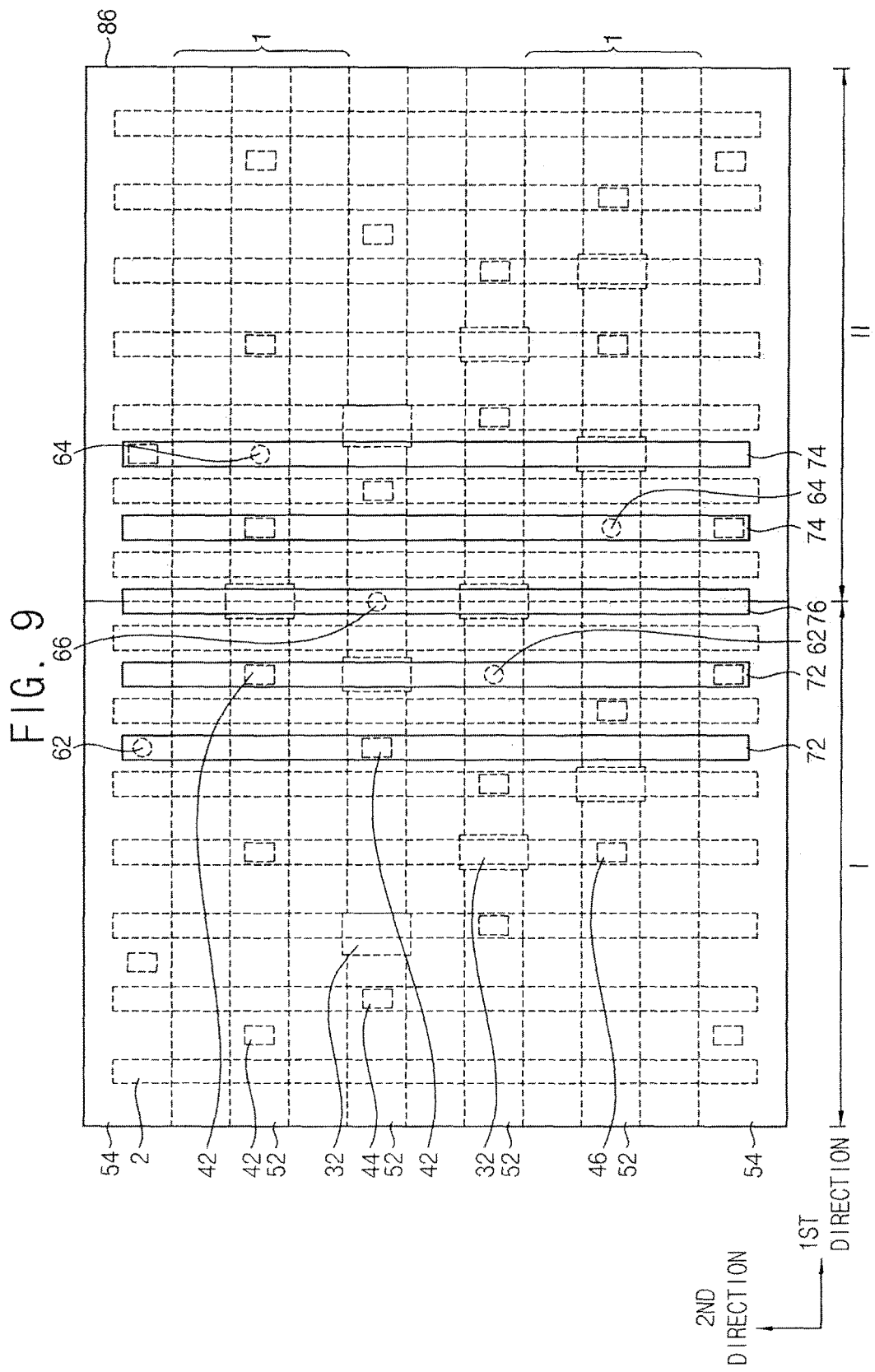

Referring to FIG. 9, a fourth mask 86 including layouts of fourth to sixth vias 62, 64 and 66 and third to fifth conductive lines 72, 74 and 76 may be designed. It is noted that FIG. 9 illustrates the fourth mask 86 overlapping the third mask 84 of FIG. 3.

In example embodiments, each of the third to fifth conductive lines 72, 74, and 76 may extend in the second direction, and the third to fifth conductive lines 72, 74, and 76 may be spaced apart from each other in the first direction. The fifth conductive line 76 may be arranged at the boundary area between the first and second regions I and II, and the third and fourth conductive lines 72 and 74 may be arranged in areas of the first and second regions I and II, respectively, adjacent to the boundary area. FIG. 9 shows only the third to fifth conductive lines 72, 74 and 76 arranged at the boundary area and the areas of the first and second regions I and II adjacent to the boundary area. However, embodiments are not limited thereto, e.g., other conductive lines may be further arranged in the first and second regions I and II.

In example embodiments, each of the third to fifth conductive lines 72, 74, and 76 may be arranged between the gate lines 2 in the first direction, e.g., each of the third to fifth conductive lines 72, 74, and 76 may be arranged between two adjacent gate lines 2 in the first direction. However, embodiments are not limited thereto.

The fourth to sixth vias 62, 64, and 66 may commonly overlap one of the third to fifth conductive lines 72, 74 and 76, and one of the first and second conductive lines 52 and 54. The sixth via 66 may be arranged at the boundary area between the first and second regions I and II, and the fourth and fifth vias 62 and 64 may be arranged in areas of the first and second regions I and II, respectively, adjacent to the boundary area.

Figure 10:
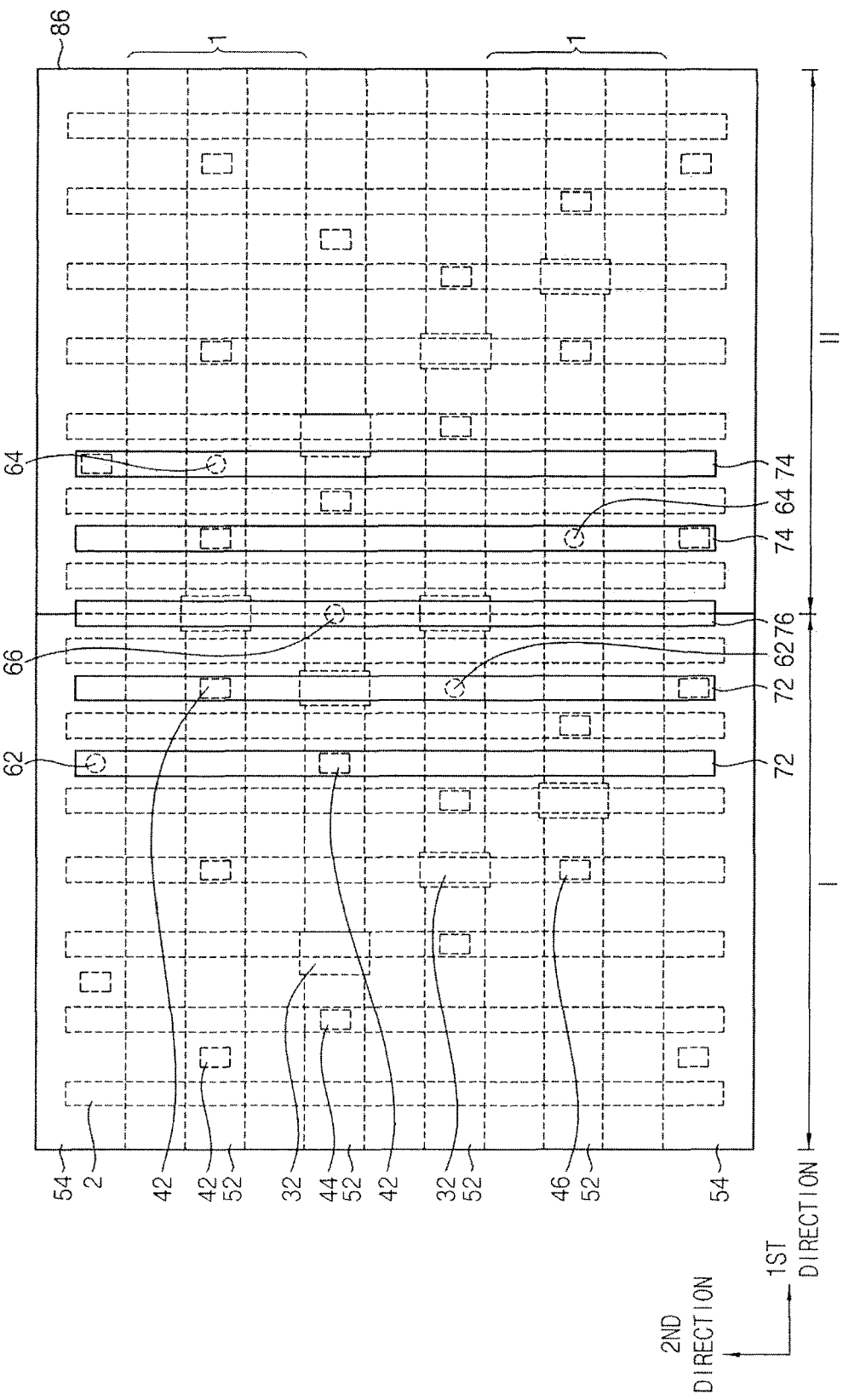

FIG. 10 shows the fourth mask 86 overlapping the third mask 84 of FIG. 7. As illustrated in FIG. 10, a plurality of the second insulation blocks 34 may be arranged not only at the boundary between the first and second regions I and II but also in the first and second regions I and II, and may not be arranged in the second direction in parallel, e.g., may be arranged in a zigzag parallel. Thus, the sixth via 66 commonly overlapping the first and fifth conductive lines 52 and 76 may be arranged at the boundary area. That is, when the first and fifth conductive lines 52 and 76 are actually formed on the substrate, the first conductive line 52 may receive electrical signals from the fifth conductive line 76 at the boundary area through the sixth via 66.

Additionally, the fifth via 64 may commonly overlap the fourth conductive line 74 in the second region II and the first conductive line 52. Thus, when the first and fourth conductive lines 52 and 74 are actually formed on the substrate, a portion of the first conductive line 52 in the first region I may receive electrical signals from the fourth conductive line 74 in the second region II through the fifth via 64. That is, the portion of the first conductive line 52 in the first region I may receive electrical signals from the fourth conductive line 74 in the second region II, and a portion of the first conductive line 52 in the second region II may receive electrical signals from the third conductive line 72 in the first region I.

For example, if a layout of a mask were to include a single continuous insulation block in the second direction at the boundary area between the first and second regions I and II, rather than the plurality of the second insulation blocks 34 of the example embodiments, the single continuous insulation block would have commonly overlapped the plurality of first conductive lines 52 arranged in the second direction at the boundary area between the first and second regions I and II. However, due to the single continuous insulation block at the boundary area, no sixth via commonly overlapping the fifth conductive line 76 and the first conductive line 52 could have been arranged at the boundary area. Thus, when the first and fifth conductive lines 52 and 76 were to be actually formed on the substrate, the first conductive line 52 could have received no electrical signals from the fifth conductive line 76 at the boundary area.

Additionally, as each of the first conductive lines 52 would have been divided into two separate portions in the first and second regions I and II, respectively, by the single continuous insulation block, when the first to fourth conductive lines 52, 54, 72 and 74 were to be actually formed on the substrate, a portion of the first conductive line 52 in the first region I could not have receives electrical signals from the fourth conductive line 74 in the second region II through the fourth and fifth vias 62 and 64, and a portion of the first conductive line 52 in the second region II could not have receives electrical signals from the third conductive line 72 in the second region II through the fourth and fifth vias 62 and 64.

Figure 25:
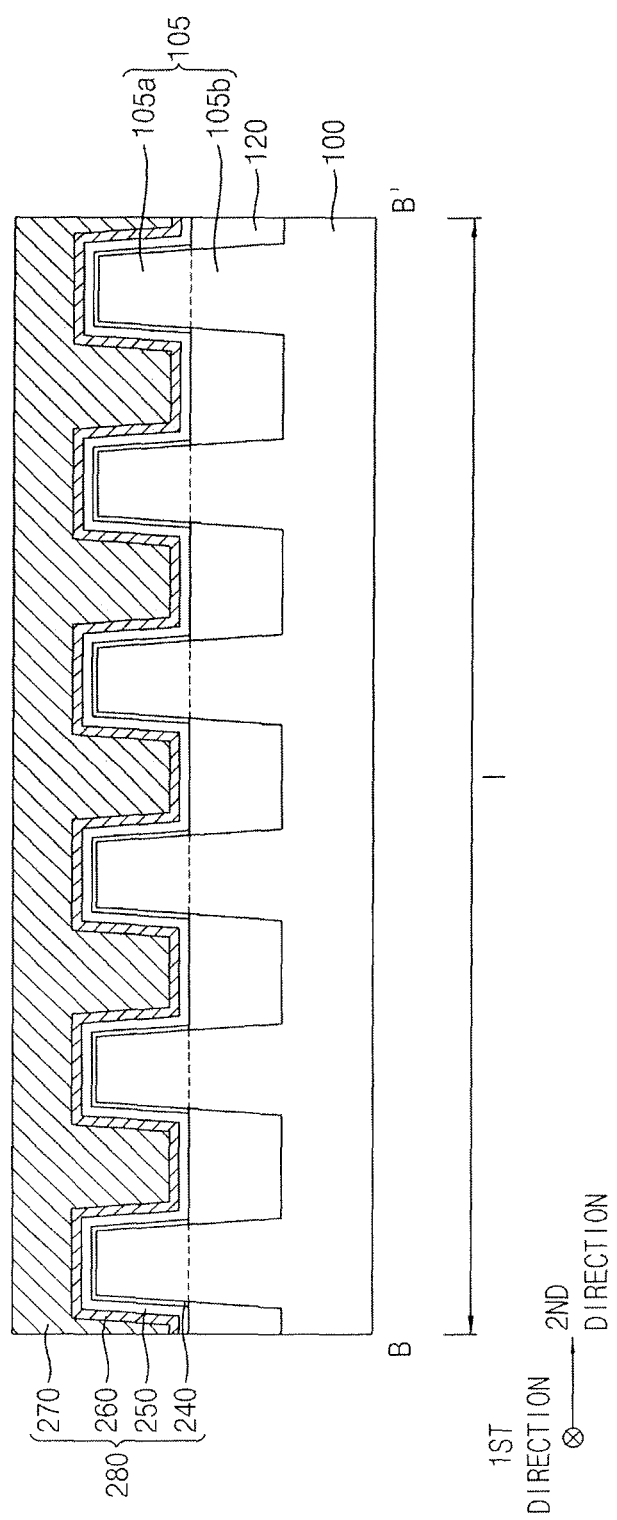
Figure 26:
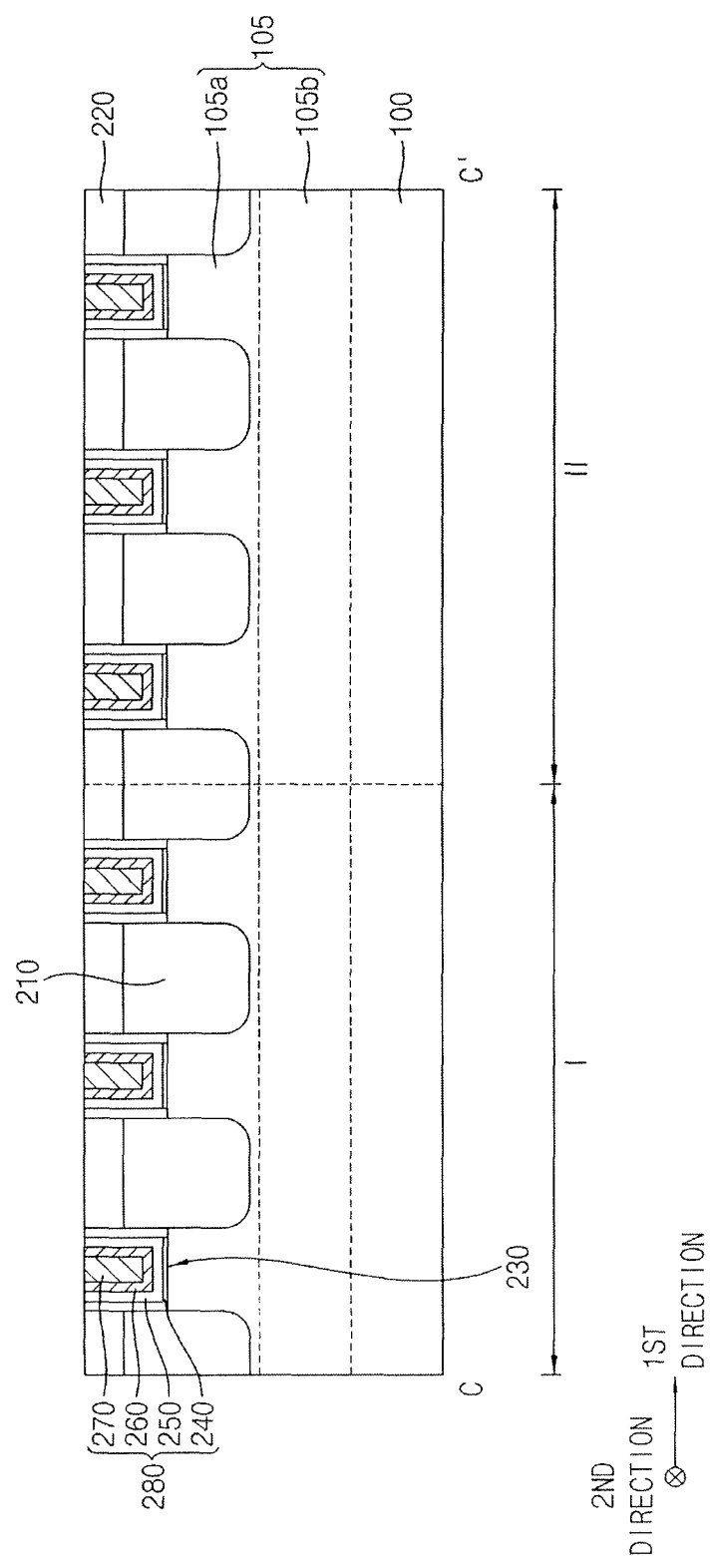
Figure 36:
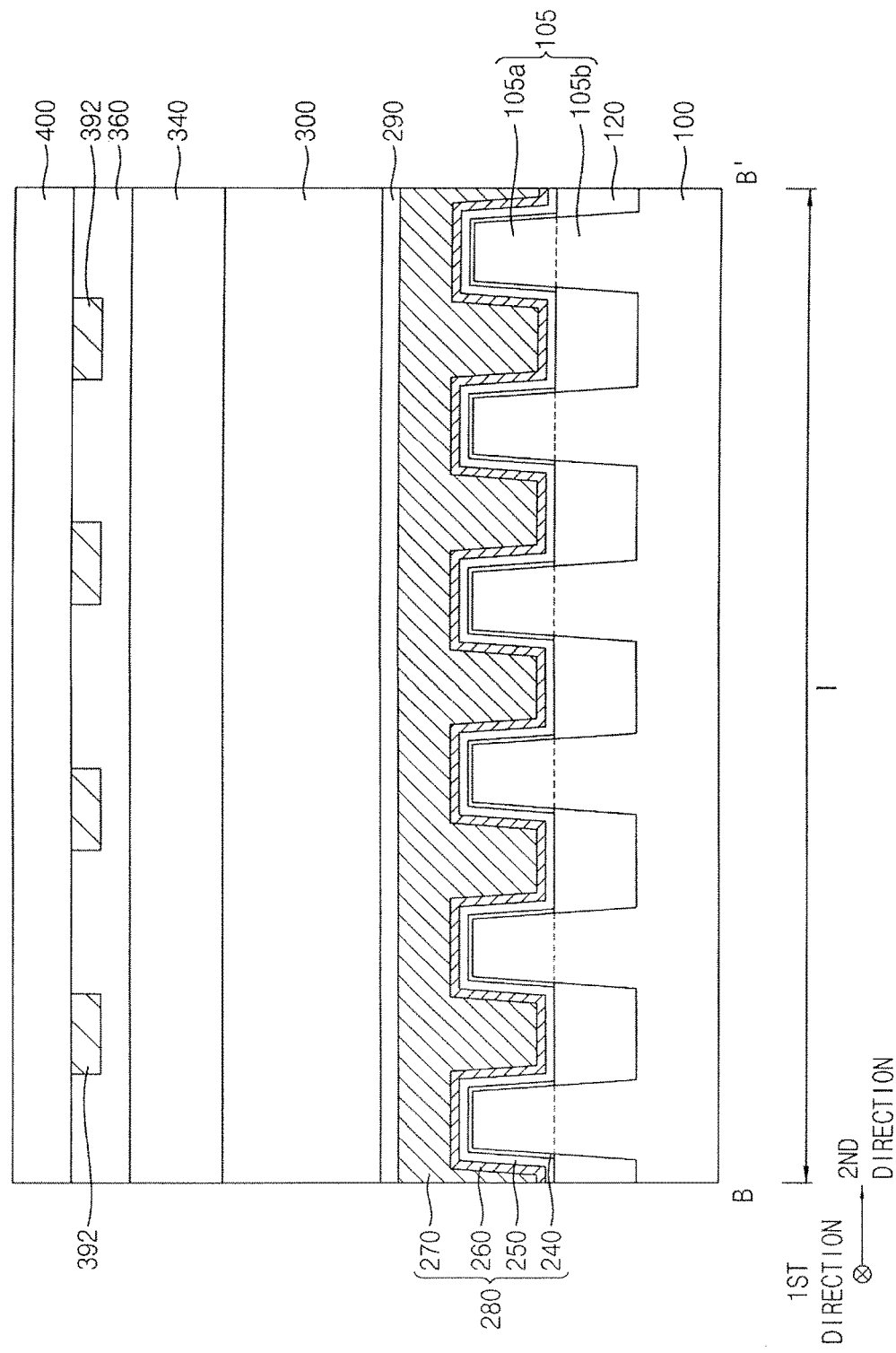
Figure 37:
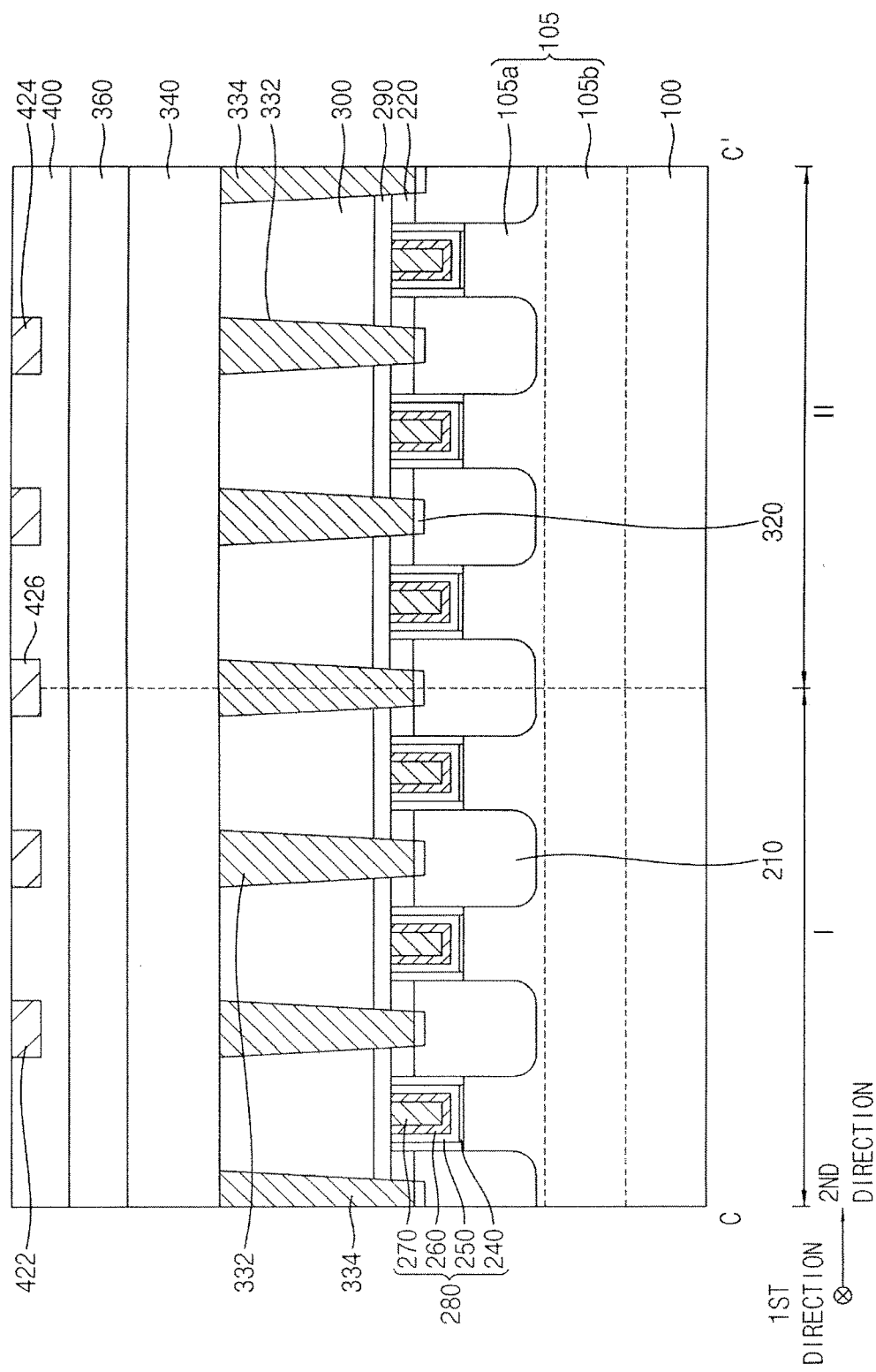
Figure 38:
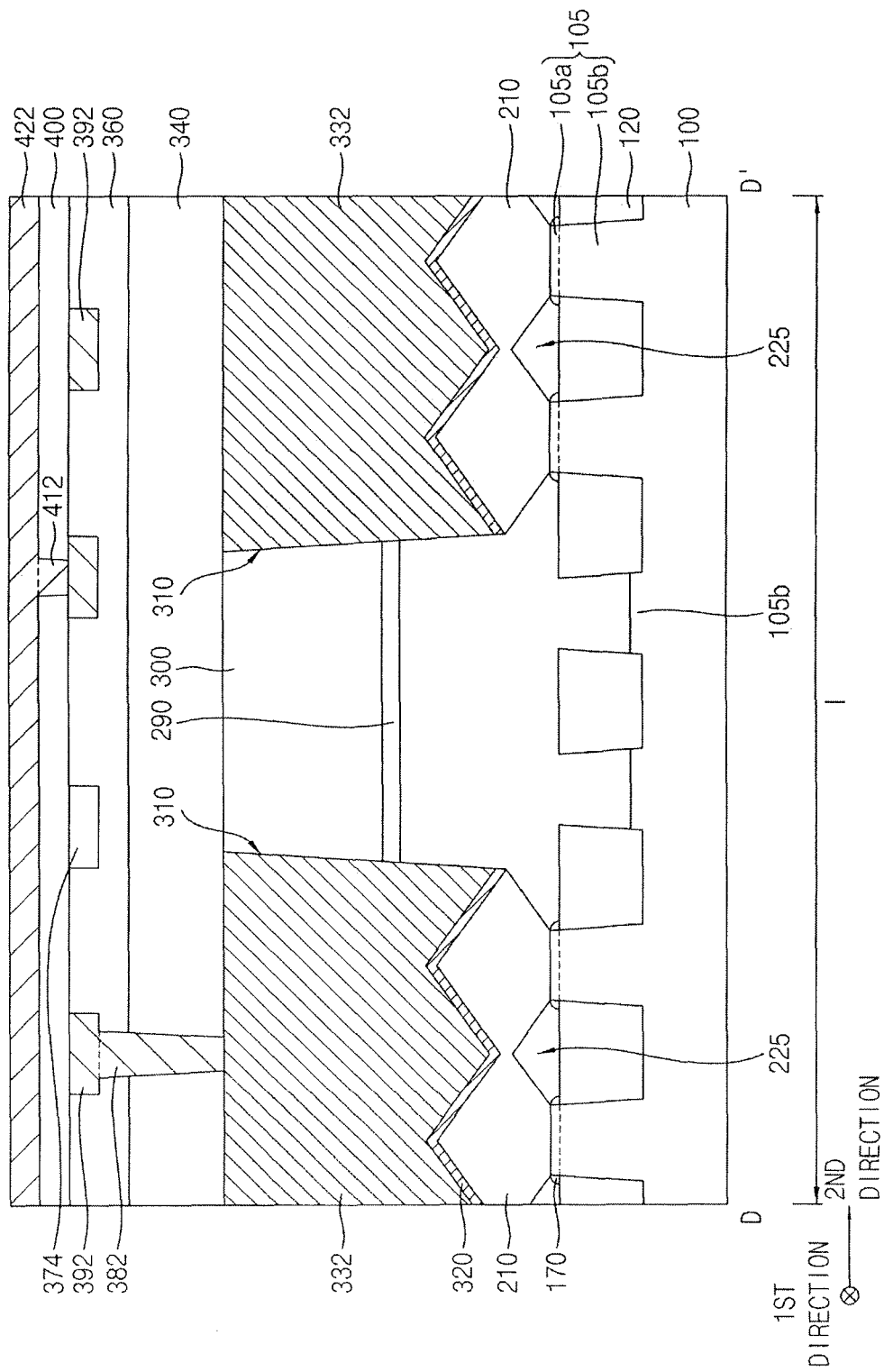
Figure 39:
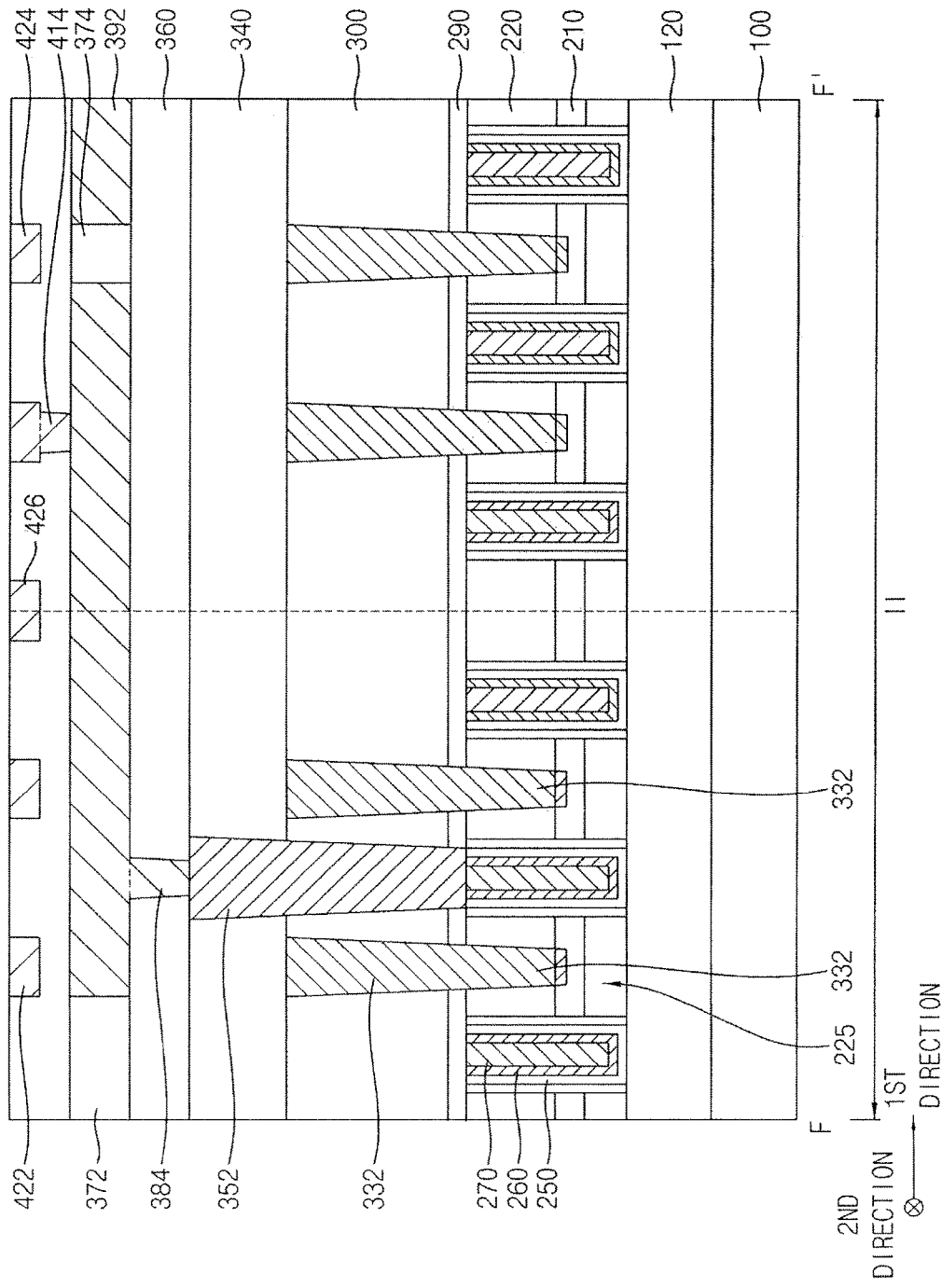

FIGS. 11 to 39 are plan views and cross-sectional views illustrating stages of a method of manufacturing a semiconductor device in accordance with example embodiments. In detail, FIGS. 11, 13, 16, 20, 23, 27, 30, 32 and 34 are plan views of stages in a method of manufacturing a semiconductor device in accordance with example embodiments, and FIGS. 12, 14-15, 17-19, 21-22, 24-26, 28-29, 31, 33 and 35-39 are cross-sectional views of respective ones of FIGS. 11, 13, 16, 20, 23, 27, 30, 32. In further detail, FIGS. 12, 17, 19, 21, 24 and 35 are cross-sectional views taken along lines A-A' of corresponding plan views, respectively, FIGS. 14, 25 and 36 are cross-sectional views taken along lines B-B' of corresponding plan views, respectively, FIGS. 15, 18, 22, 26, 28 and 37 are cross-sectional views taken along lines C-C' of corresponding plan views, respectively, FIGS. 29 and 38 are cross-sectional views taken along lines D-D' of corresponding plan views, respectively, FIGS. 31 and 33 are cross-sectional views taken along lines E-E' of corresponding plan views, respectively, and FIG. 39 is a cross-sectional view taken along line F-F' of a corresponding plan view.

This method may use the method of designing the layout of the semiconductor device described previously with reference to FIGS. 1 to 10. Thus, detailed descriptions of elements in FIGS. 1-10 are omitted hereinafter.

Figure 11:
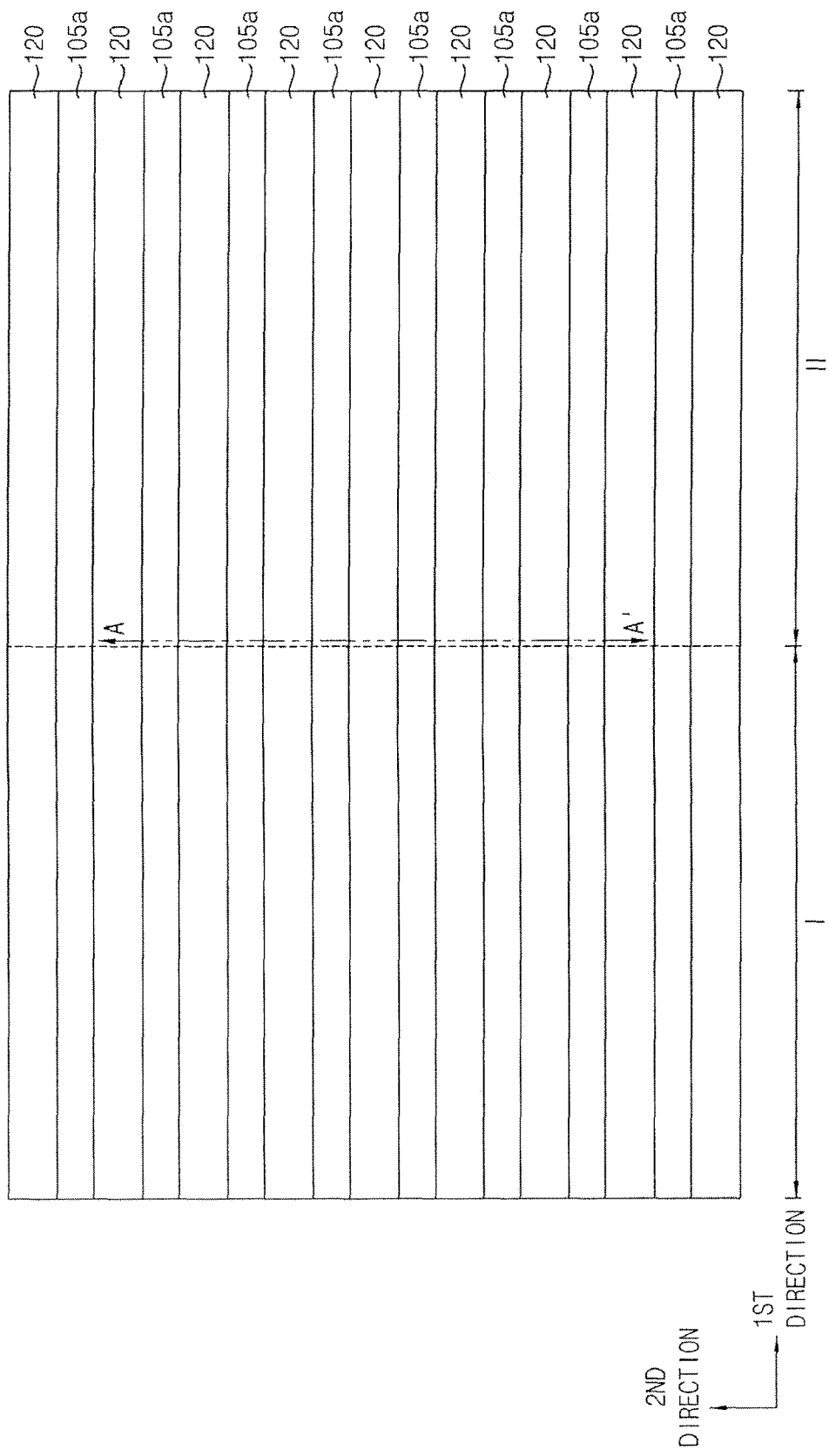
FIGS. 11 to 39 illustrate plan views and cross-sectional views of stages in a method of manufacturing a semiconductor device in accordance with example embodiments.
Figure 12:
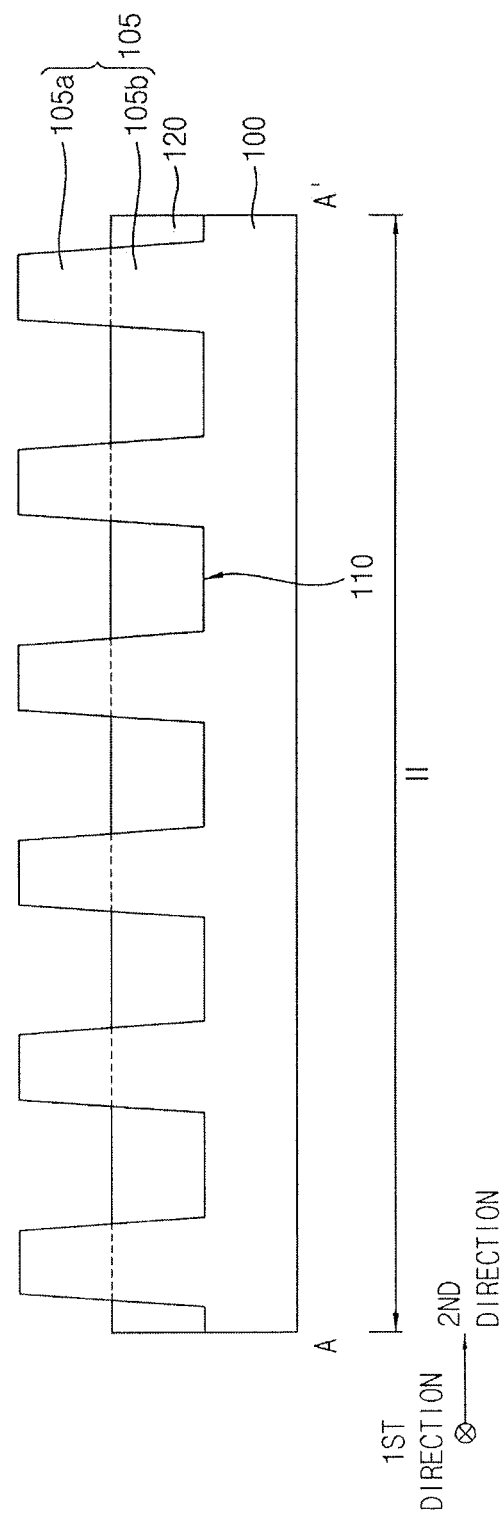

Referring to FIGS. 11 and 12, an upper portion of a substrate 100 may be partially etched to form a first recess 110, and an isolation pattern 120 may be formed to fill a lower portion of the first recess 110.

The substrate 100 may include a semiconductor material, e.g., silicon, germanium, silicon-germanium, etc., or III-V semiconductor compounds, e.g., GaP, GaAs, GaSb, etc. In some embodiments, the substrate 100 may be a silicon-on-insulator (SOI) substrate, or a germanium-on-insulator (GOI) substrate. The substrate 100 may include first and second regions I and II. In example embodiments, the first and second regions I and II may be regions on which first and second cells, respectively, of the semiconductor device may be formed. FIGS. 11 and 12 show the first and second regions I and II only, however, embodiments are not limited thereto, and the substrate 100 may further include regions on which other cells may be formed.

As the first recess 110 is formed on the substrate 100, an active region 105 and a field region may be defined in the substrate 100. The active region 105 may protrude from an upper surface of the substrate 100, and thus may be also referred to as an active fin. In example embodiments, the active fin 105 may extend in a first direction substantially parallel to the upper surface of the substrate 100, and a plurality of the active fins 105 may be formed in a second direction, which may be substantially parallel to the upper surface of the substrate 100 and cross the first direction. In example embodiments, the first and second directions may cross each other at a right angle, and thus may be substantially perpendicular to each other.

In example embodiments, the isolation pattern 120 may be formed by forming an isolation layer on the substrate 100 to sufficiently fill the first recess 110, planarizing the isolation layer until the upper surface of the substrate 100 may be exposed, and removing an upper portion of the isolation layer to expose an upper portion of the first recess 110. As the isolation pattern 120 is formed on the substrate 100, the active fin 105 may be divided into a lower active pattern 105b with sidewalls covered by the isolation pattern 120, and an upper active pattern 105a not covered by the isolation pattern 120 but protruding thereabove.

Figure 13:
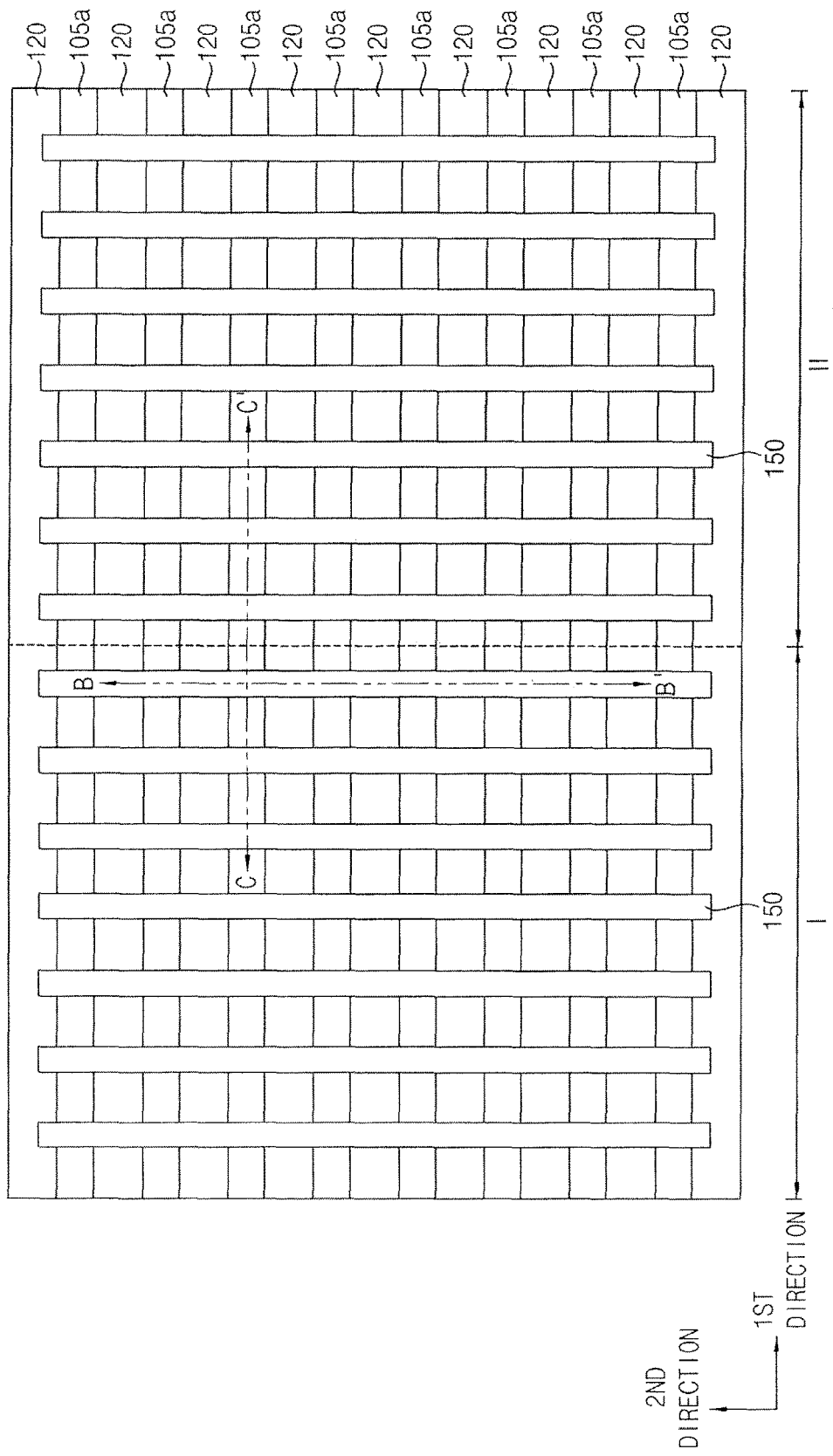
Figure 14:
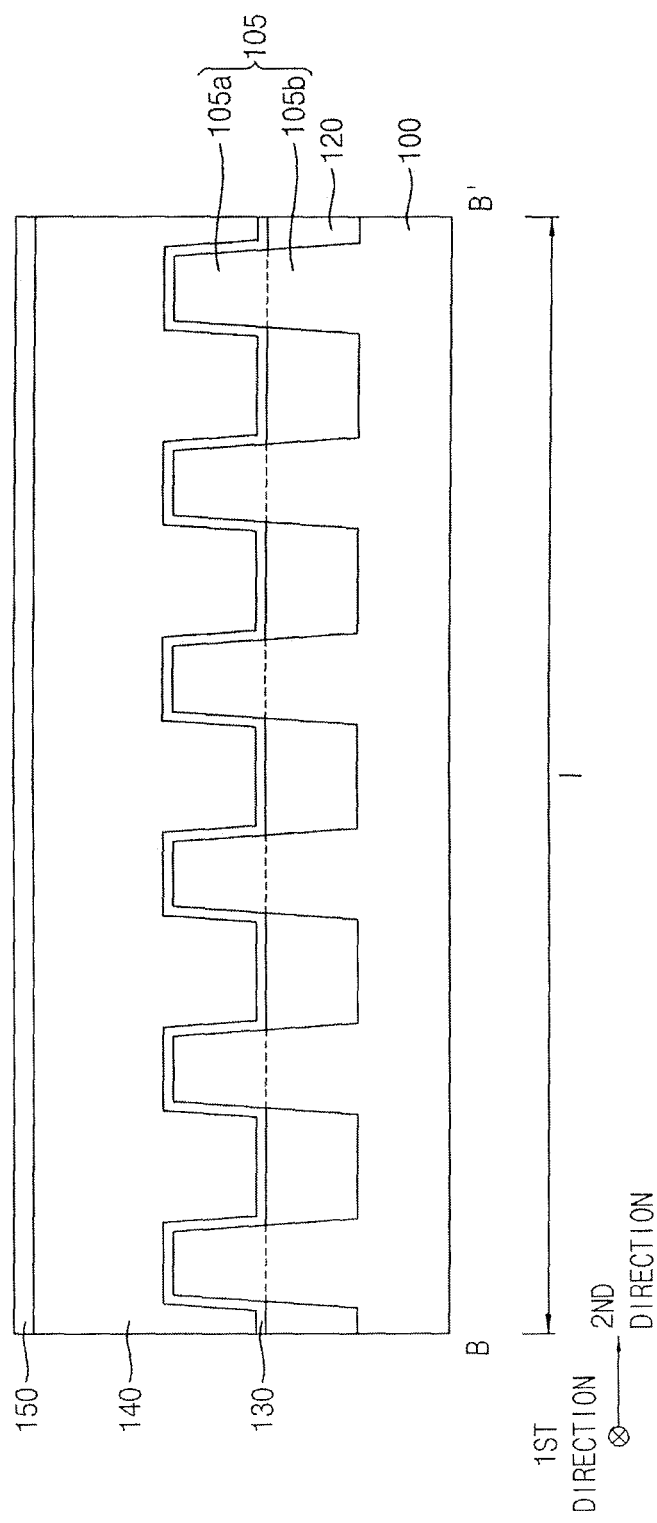
Figure 15:
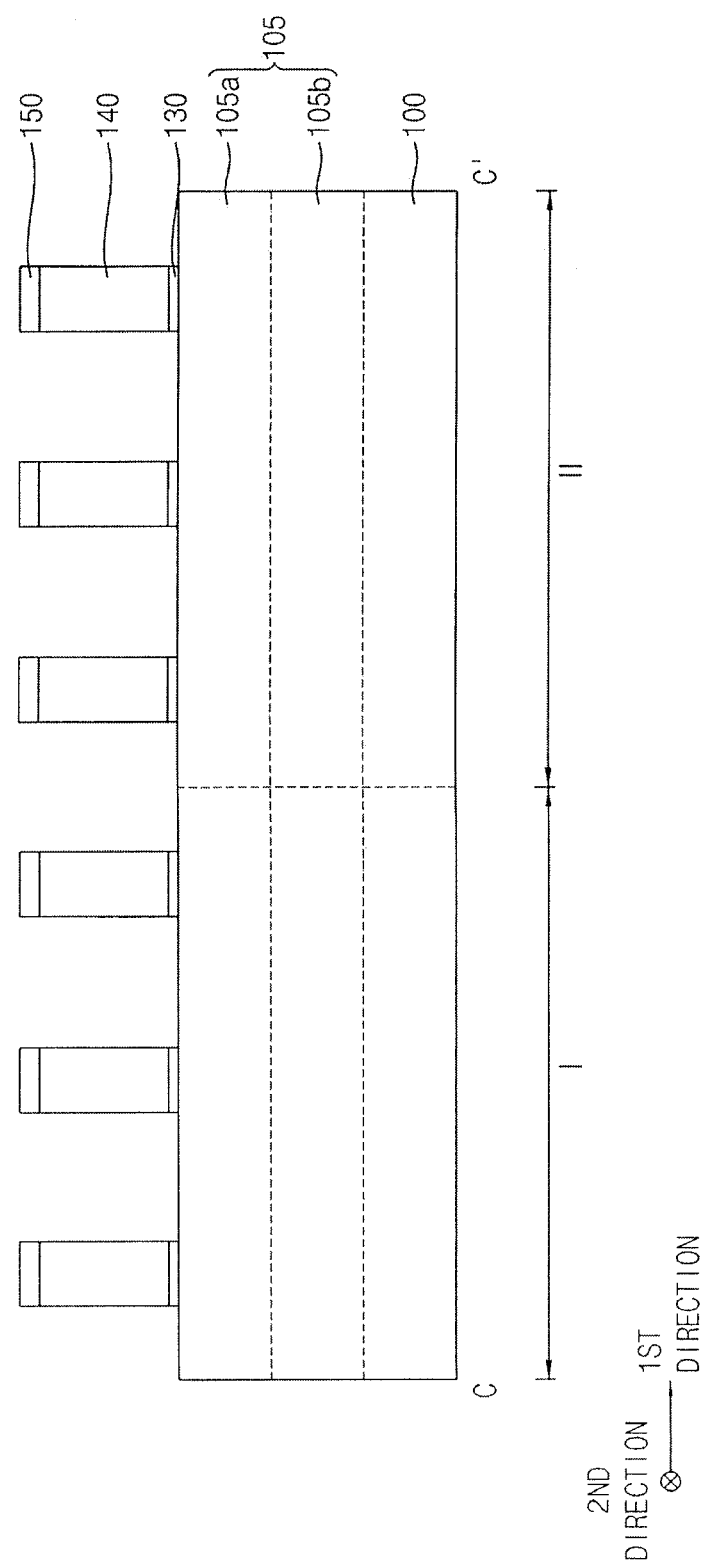

Referring to FIGS. 13 to 15, a dummy gate structure may be formed on the substrate 100.

In detail, the dummy gate structure may be formed by sequentially forming a dummy gate insulation layer, a dummy gate electrode layer, and a dummy gate mask layer on the active fin 105 of the substrate 100 and on the isolation pattern 120, followed by patterning the dummy gate mask layer to form a dummy gate mask 150. Then, sequentially etching the dummy gate electrode layer and the dummy gate insulation layer using the dummy gate mask 150 as an etching mask. Thus, the dummy gate structure may include a dummy gate insulation pattern 130, a dummy gate electrode 140, and the dummy gate mask 150 sequentially stacked on the substrate 100.

The dummy gate insulation layer may be formed by a chemical vapor deposition (CVD) process, an atomic layer deposition (ALD) process, etc. Alternatively, the dummy gate insulation layer may be formed by a thermal oxidation process on an upper portion of the substrate 100, and in this case, the dummy gate insulation layer may be formed only on the active fin 105.

In example embodiments, the dummy gate structure may be formed to extend in the second direction, and a plurality of dummy gate structures may be formed in the first direction.

Figure 16:
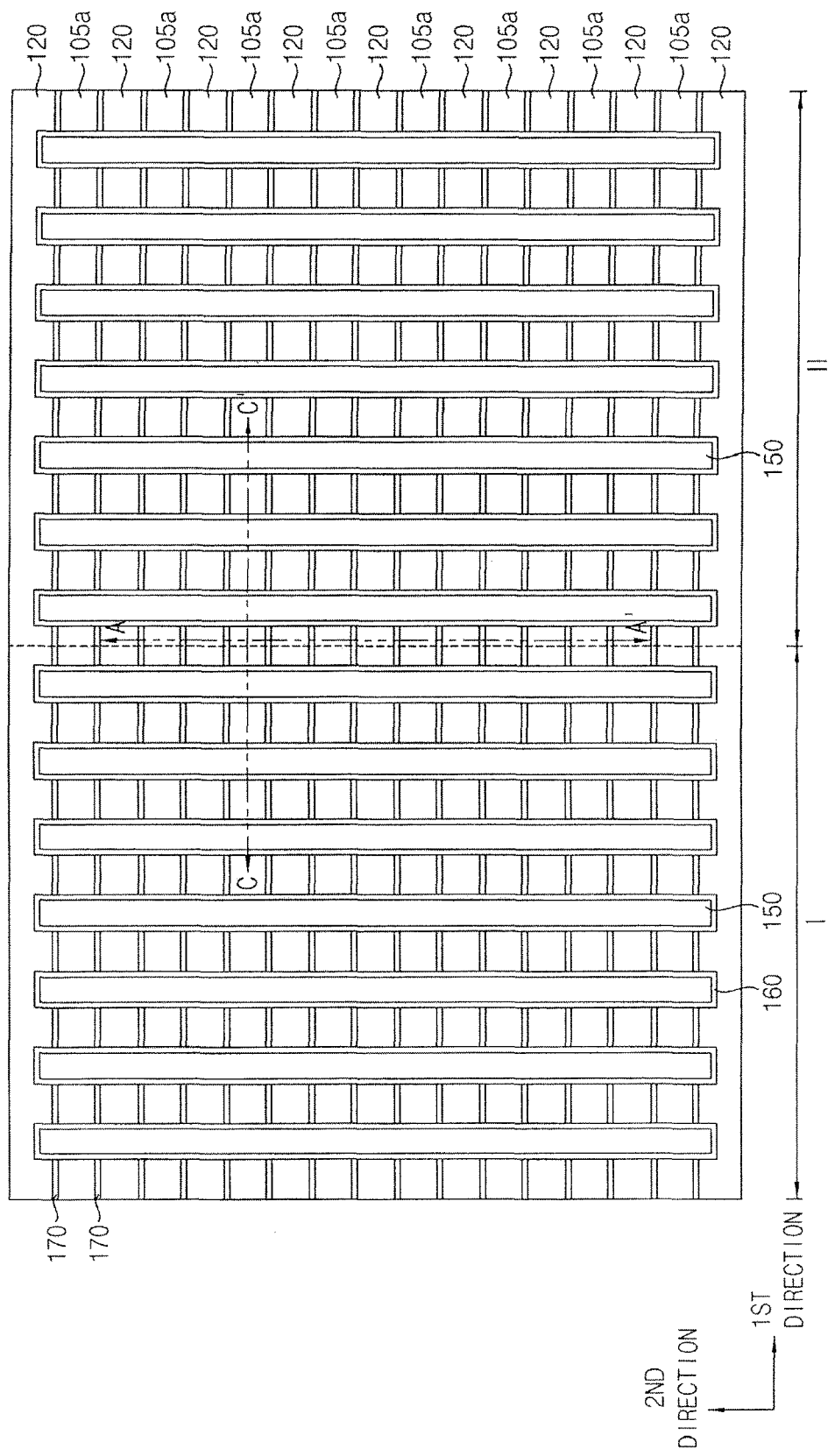
Figure 17:
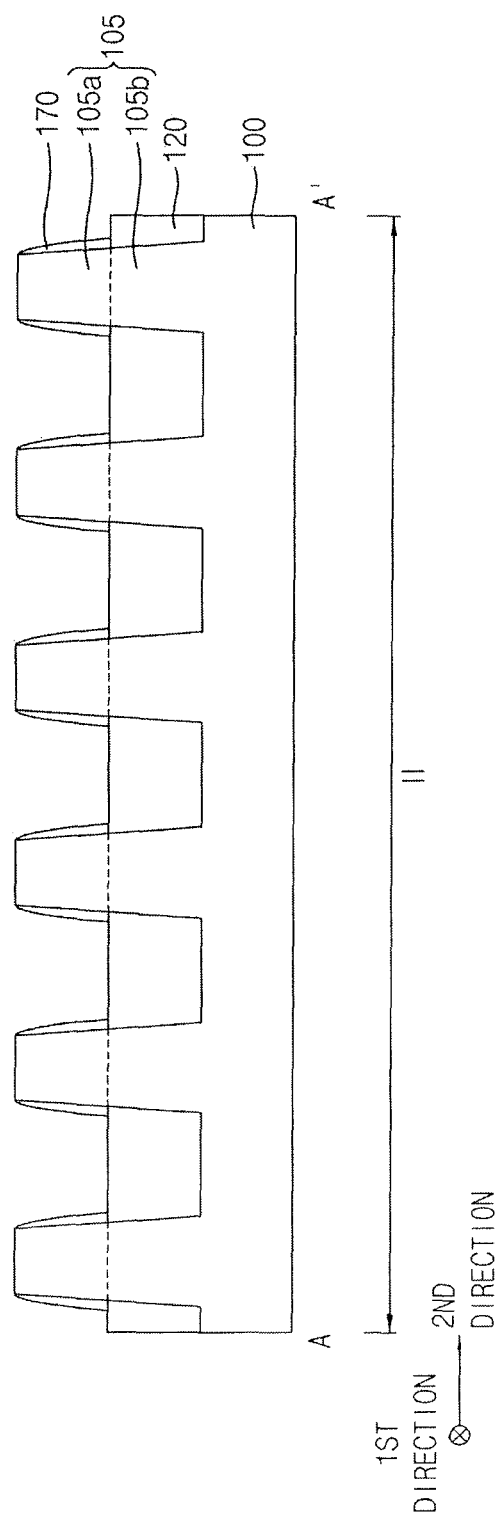
Figure 18:
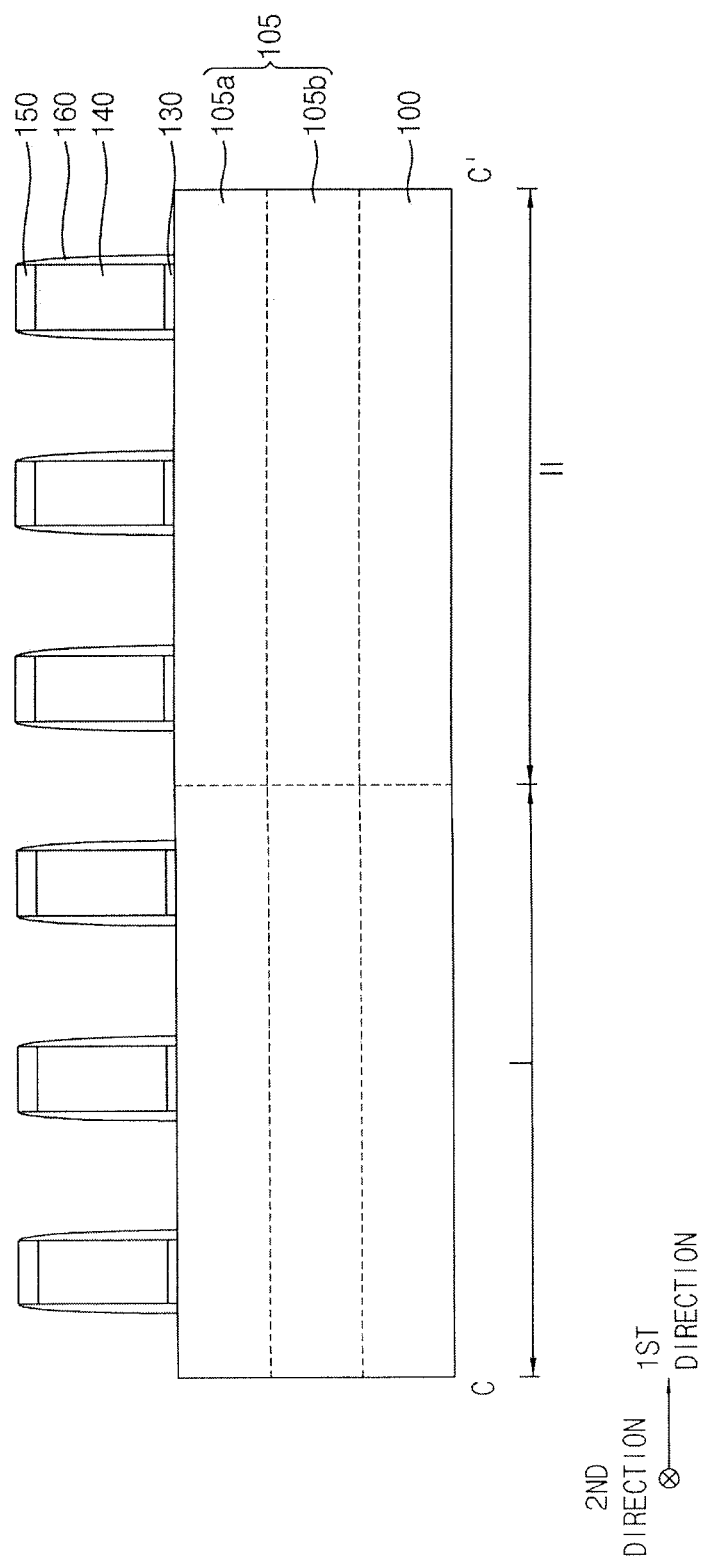

Referring to FIGS. 16 to 18, a gate spacer 160 may be formed on a sidewall of the dummy gate structure. The gate spacer 160 may be formed by forming a spacer layer on the active fin 105 of the substrate 100 and the isolation pattern 120 to cover the dummy gate structure, and anisotropically etching the spacer layer. The gate spacer 160 may be formed on each of opposite sidewalls of the dummy gate structure in the first direction, and a fin spacer 170 may be also formed on each of opposite sidewalls of the upper active pattern 105a in the second direction.

Figure 19:
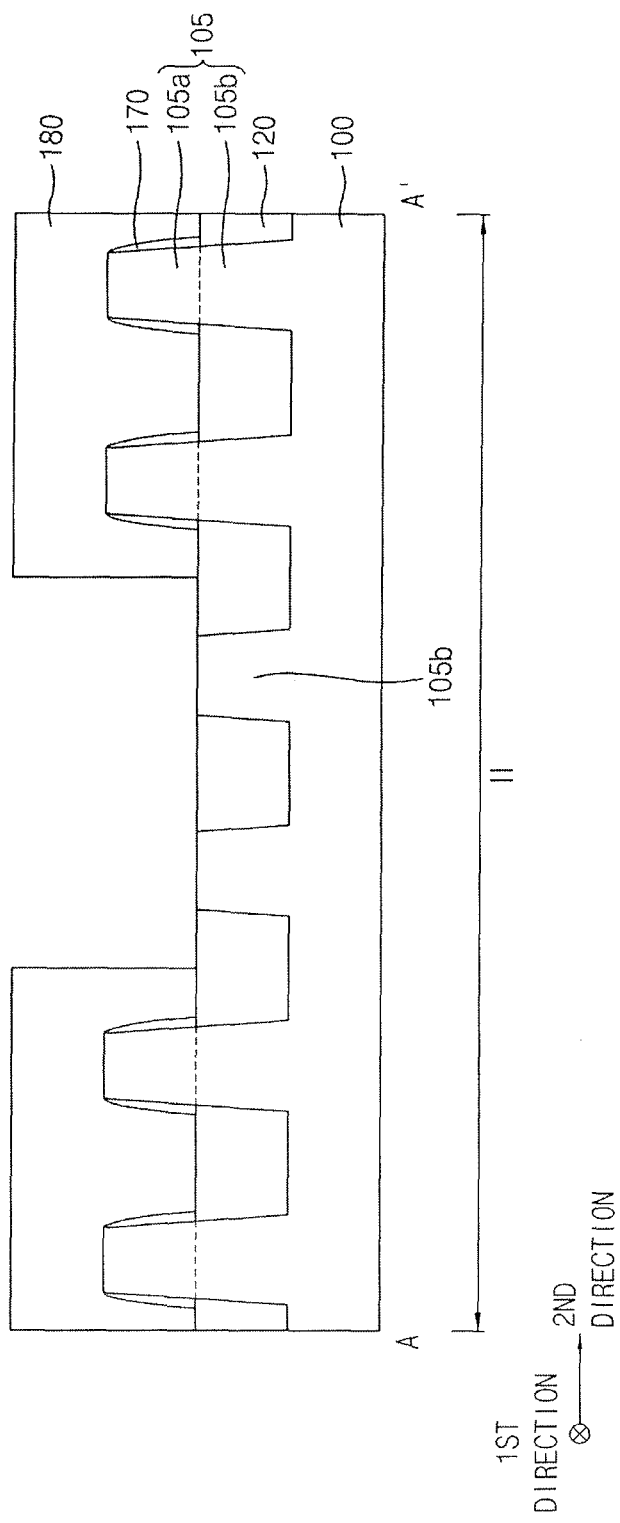

Referring to FIG. 19, an etching mask 180 may be formed to cover ones of the active fins 105 and expose other ones of the active fins 105, and the upper active patterns 105a of the exposed active fins 105 may be removed using the etching mask 180 to form dummy active fins including only the lower active patterns 105b, respectively.

In example embodiments, the etching mask 180 may expose one or more than one active fins 105, and thus one or more than one dummy active fins may be formed. FIG. 19 shows that the upper active patterns 105a of neighboring two active fins 105 are removed to form two dummy active fins, however, embodiments are not limited thereto.

When the dummy active fins are formed, the fin spacers 170 on the sidewalls of the upper active patterns 105a may be also removed.

Figure 20:
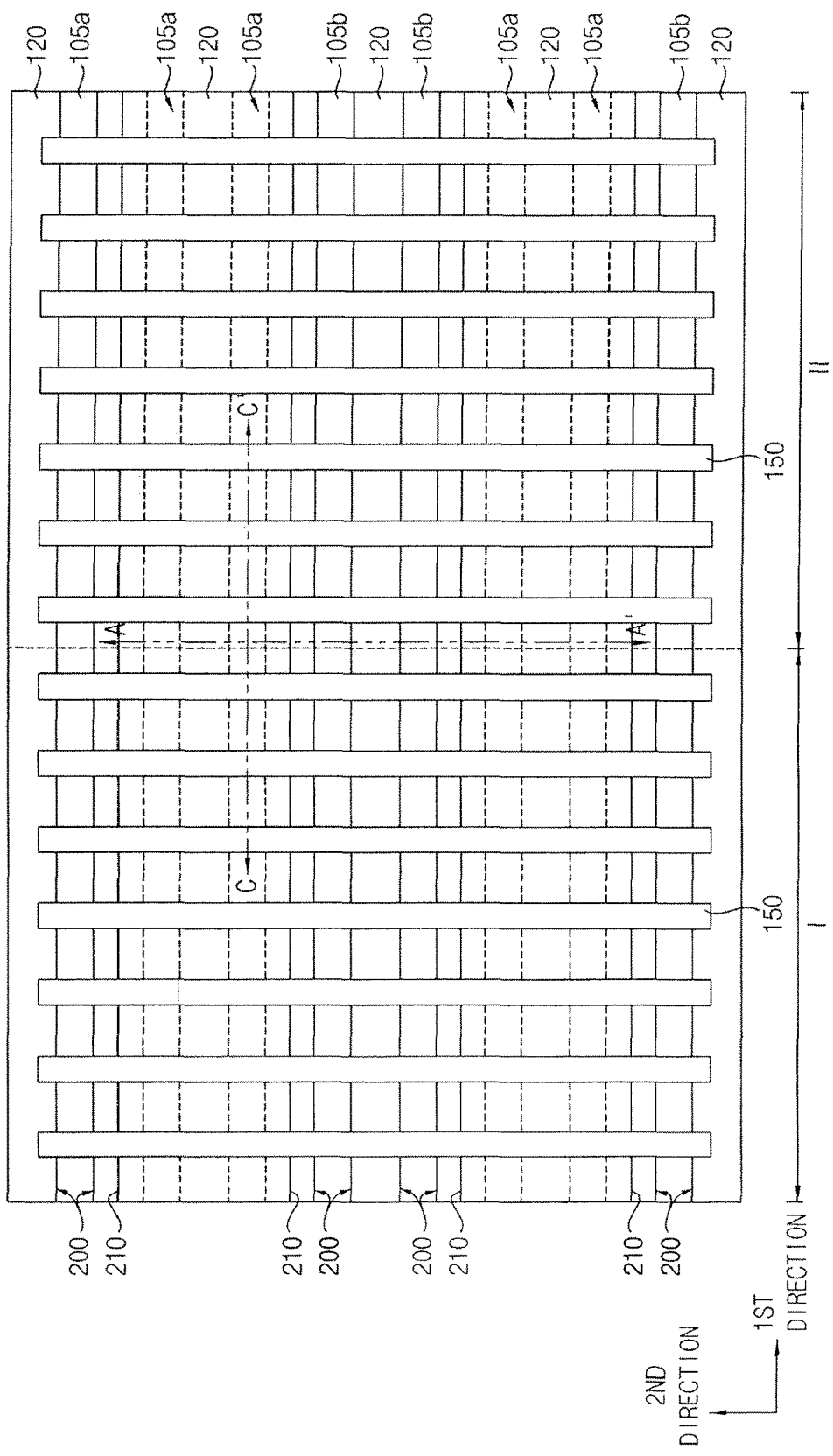
Figure 21:
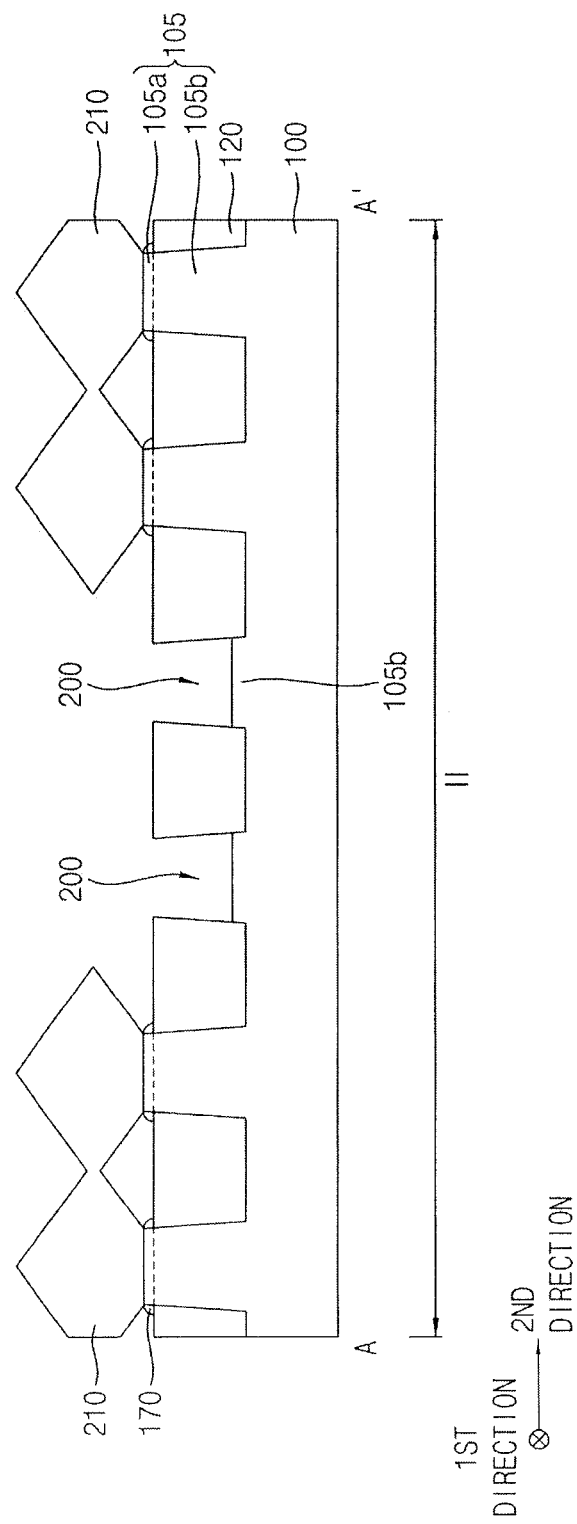
Figure 22:
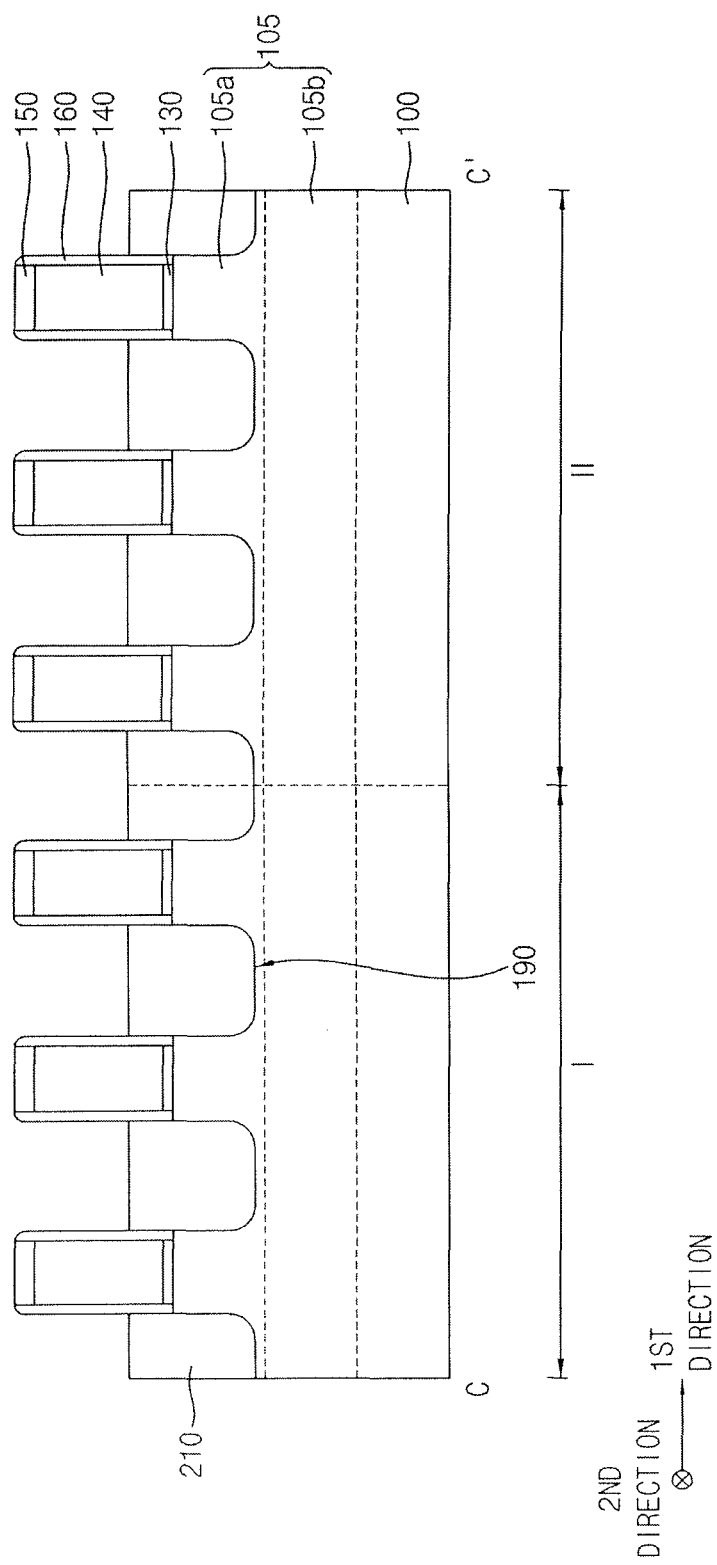
Figure 23:
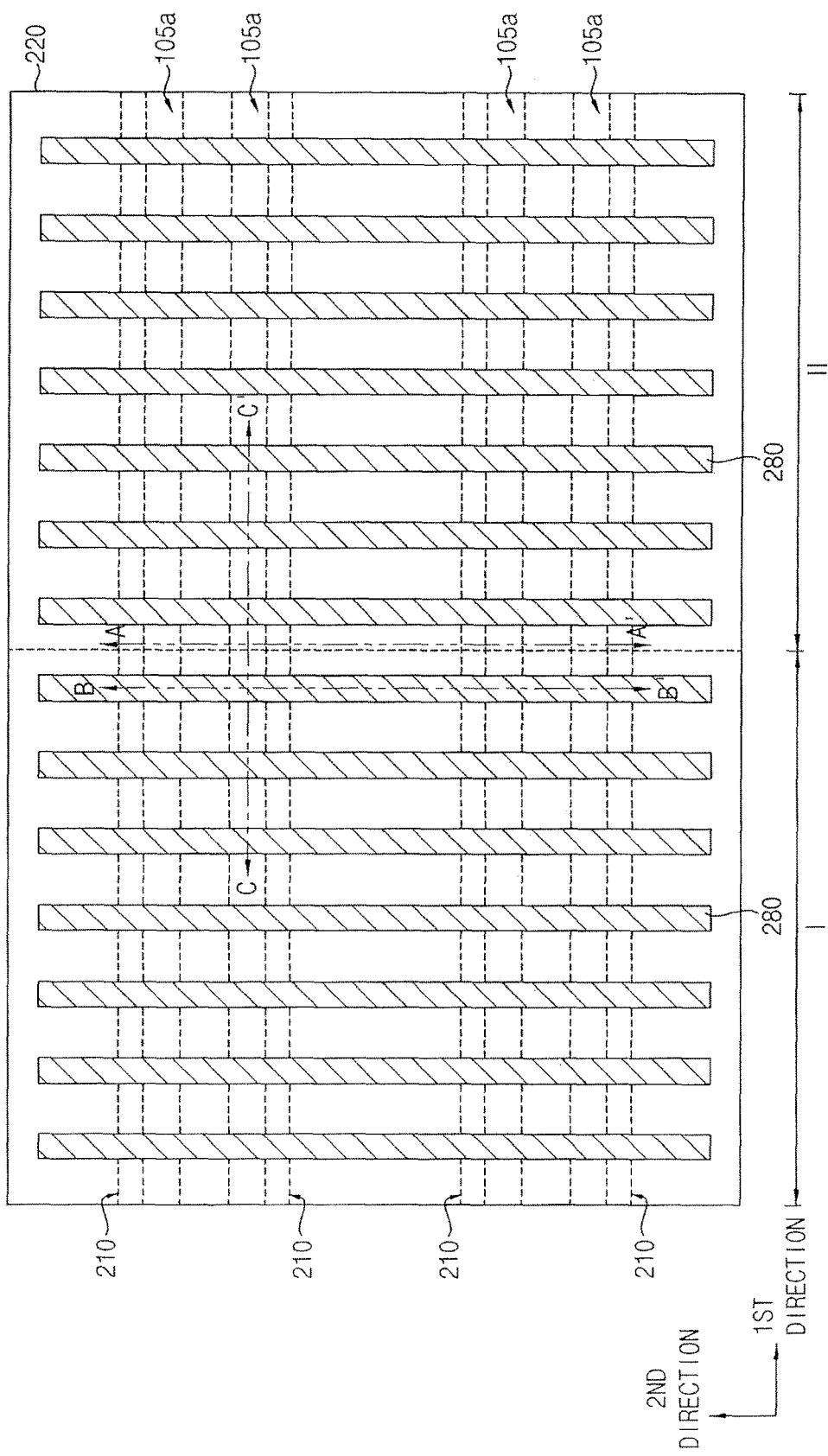
Figure 24:
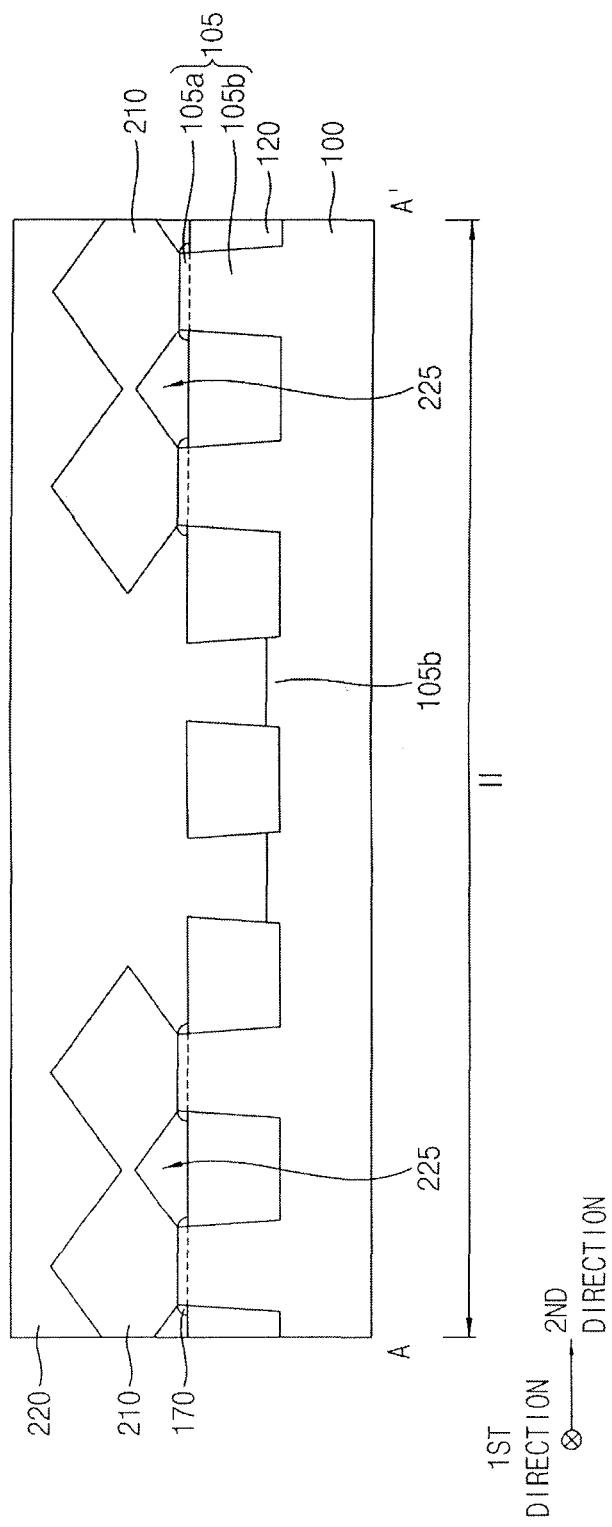

Referring to FIGS. 20 to 22, after removing the etching mask 180, an upper portion of the active fin 105 adjacent the gate spacer 160 may be etched to form a second recess 190. Hereinafter, in order to avoid the complexity of drawings, the gate spacer 160 and the fin spacer 170 will not be shown in plan views.

In detail, the upper portion of the active fin 105 may be removed by a dry etching process using the dummy gate structure and the gate spacer 160 on a sidewall thereof as an etching mask to form the second recess 190. When the second recess 190 is formed, the fin spacer 170 adjacent the active fin 105 may be mostly removed, and only a lower portion of the fin spacer 170 may remain. The lower active patterns 105b of the dummy active fins may be also partially or entirely removed to form a third recess 200.

In the figure, as a portion of the upper active pattern 105a is etched to form the second recess 190, a bottom of the second recess 190 is higher than a top surface of the lower active pattern 105b. However, embodiments are not limited thereto.

After forming a mask to fill the third recess 200, a source/drain layer 210 may be formed to fill the second recess 190. In example embodiments, the source/drain layer 210 may be formed by a selective epitaxial growth (SEG) process using an upper surface of the active fin 105 exposed by the second recess 190 as a seed.

In example embodiments, as the SEG process is performed, a single crystalline silicon-germanium layer may be formed to serve as the source/drain layer 210. Additionally, a p-type impurity source gas may be also used to form a single crystalline silicon-germanium layer doped with p-type impurities serving as the source/drain layer 210. Thus, the source/drain layer 210 may serve as a source/drain region of a PMOS transistor.

The source/drain layer 210 may grow not only in a vertical direction but also in a horizontal direction to fill the second recess 190, and may contact a sidewall of the gate spacer 160.

In example embodiments, when the active fins 105 disposed in the second direction are close to each other, the source/drain layers 210 growing on the respective active fins 105 may be merged with each other. FIGS. 20 to 22 show that two source/drain layers 210 grown on neighboring two active fins 105 are merged with each other, however, embodiments are not limited thereto. Thus, more than two source/drain layers 210 may be merged with each other.

The source/drain layer 210 is illustrated as a source/drain region of the PMOS transistor. However, embodiments are not limited thereto, e.g., the source/drain layer 210 may also serve as a source/drain region of an NMOS transistor.

Thus, a single crystalline silicon carbide layer or a single crystalline silicon layer may be formed as the source/drain layer 210. In the SEG process, an n-type impurity source gas may be also used to form a single crystalline silicon carbide layer doped with n-type impurities or a single crystalline silicon layer doped with n-type impurities.

Referring to FIGS. 23 to 26, after removing the mask, an insulation layer 220 may be formed on the substrate 100 to cover the dummy gate structure, the gate spacer 160, the fin spacer 170, and the source/drain layer 210, and may be planarized until the dummy gate electrode 140 of the dummy gate structure is exposed. In the planarization process, the dummy gate mask 150 may be also removed, and an upper surface of the gate spacer 160 may be removed. A space between the merged source/drain layers 210 and the isolation pattern 120 may not be filled with the insulation layer 220, and thus an air gap 225 may be formed. The planarization process may be performed by a chemical mechanical polishing (CMP) process and/or an etch back process.

The exposed dummy gate electrode 140 and the dummy gate insulation pattern 130 thereunder may be removed to form a first opening 230 exposing an inner sidewall of the gate spacer 160 and an upper surface of the active fin 105, and a gate structure 280 may be formed to fill the first opening 230. The gate structure 280 may be formed by following processes.

After performing a thermal oxidation process on the exposed upper surface of the active fin 105 exposed by the first opening 230 to form an interface pattern 240, a gate insulation layer and a workfunction control layer may be sequentially formed on the interface pattern 240, the isolation pattern 120, the gate spacer 160, and the insulation layer 220. A gate electrode layer may be formed on the workfunction control layer to sufficiently fill a remaining portion of the first opening 230.

The interface pattern 240 may be formed instead of the thermal oxidation process, by a CVD process, an ALD process, or the like. In this case, the interface pattern 240 may be formed not only on the upper surface of the active fin 105 but also on the upper surface of the isolation pattern 120 and the inner sidewall of the gate spacer 160.

The gate electrode layer, the workfunction control layer, and the gate insulation layer may be planarized until an upper surface of the insulation layer 220 is exposed to form a gate insulation pattern 250 and a workfunction control pattern 260 sequentially stacked on the interface pattern 240, the isolation pattern 120, and the inner sidewall of the gate spacer 160. A gate electrode 270 may be formed to fill the remaining portion of the first opening 230 on the workfunction control pattern 260.

The interface pattern 240, the gate insulation pattern 250, the workfunction control pattern 260, and the gate electrode 270 sequentially stacked may form the gate structure 280. The gate structure 280 together with the source/drain layer 210 may form a PMOS transistor or an NMOS transistor according to the conductivity type of the source/drain layer 210.

Hereinafter, in order to avoid the complexity of drawings, the gate insulation pattern 250 and the workfunction control pattern 260 of the gate structure will not be shown in plan views.

Figure 27:
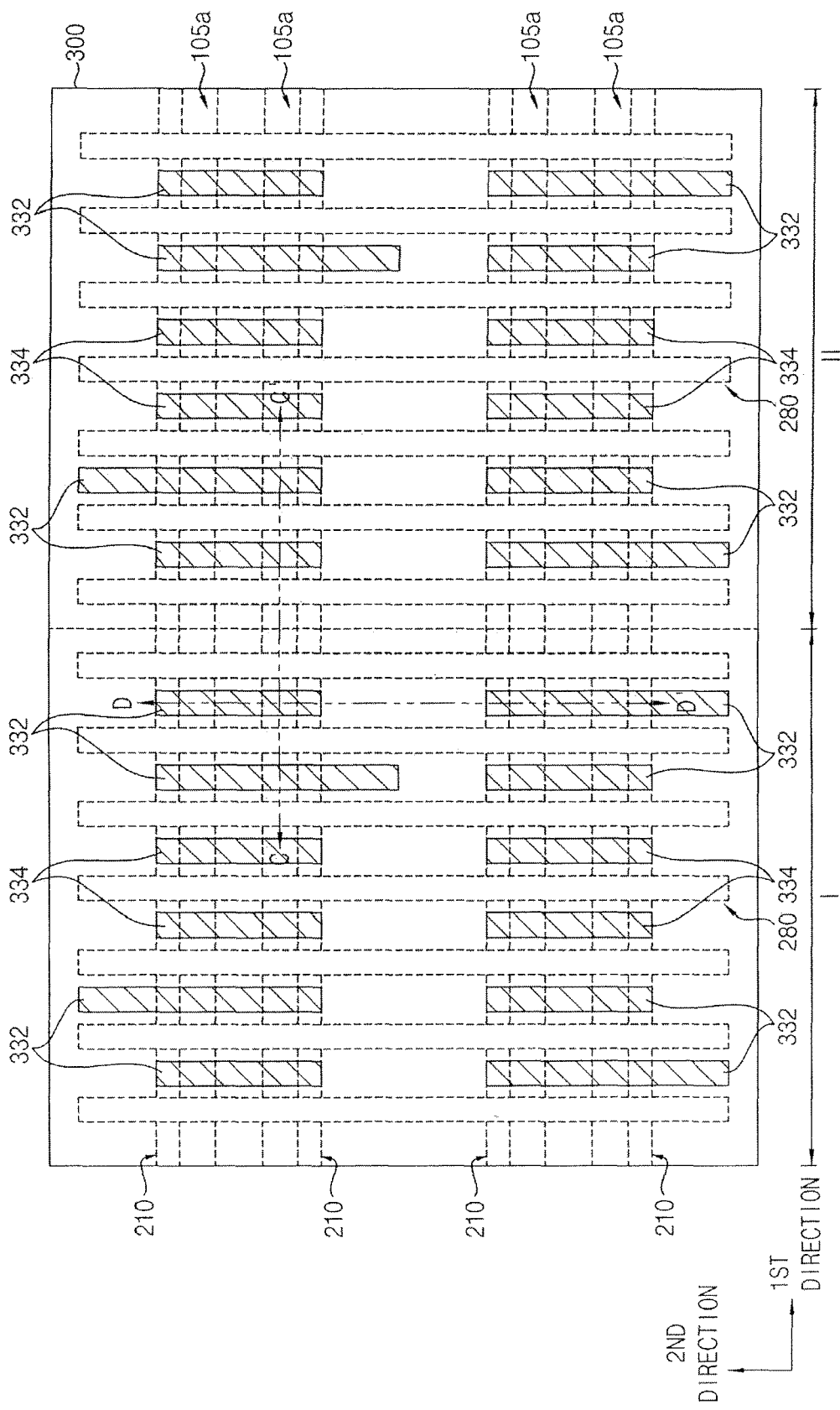
Figure 28:
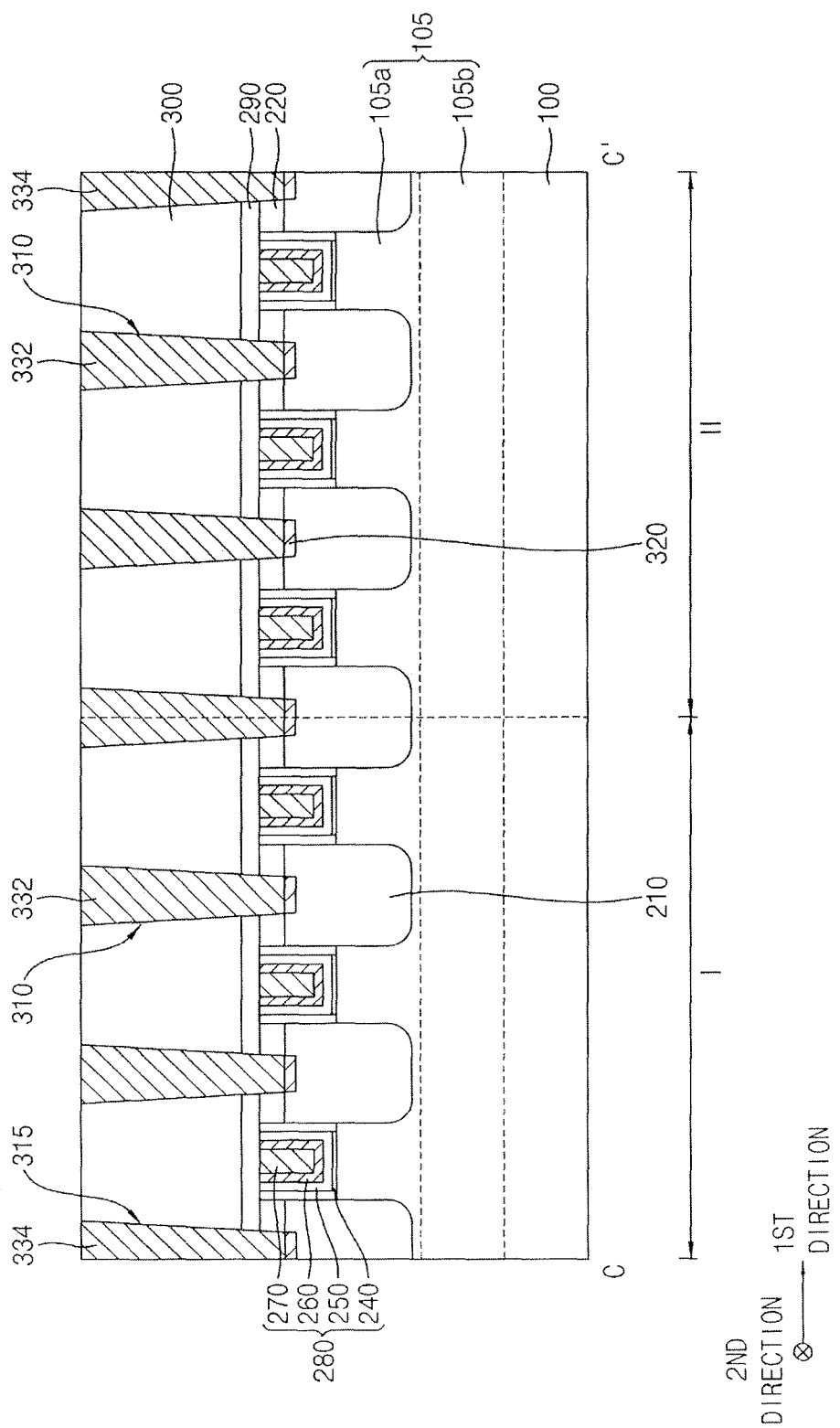
Figure 29:
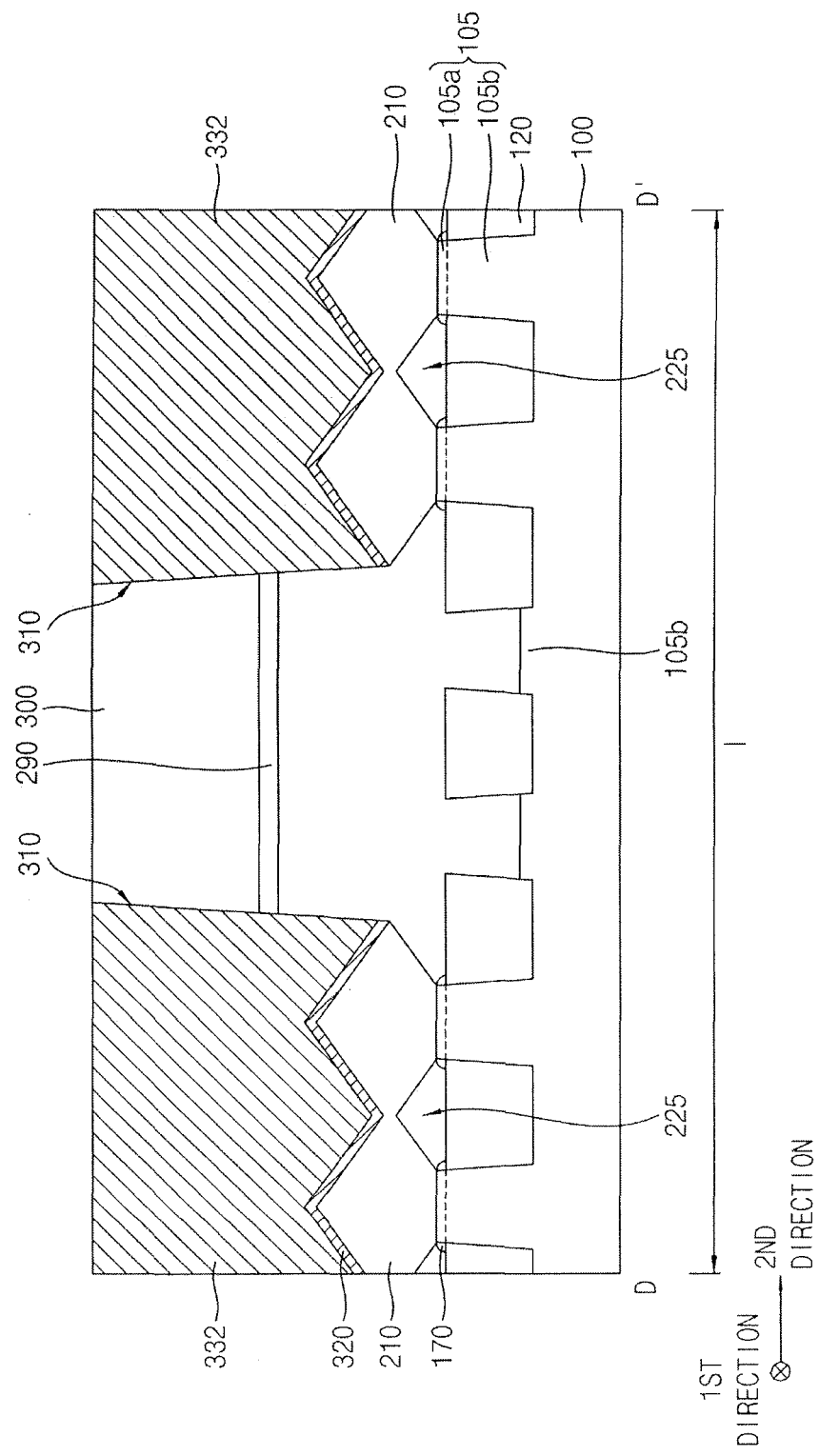

Referring to FIGS. 27 to 29, a capping layer 290 and a first insulating interlayer 300 may be sequentially formed on the insulation layer 220, the gate structure 280, and the gate spacer 160. First and second contact plugs 332 and 334 may be formed through the insulation layer 220, the capping layer 290, and the first insulating interlayer 300 to contact upper surfaces of the source/drain layers 210.

The first and second contact plugs 332 and 334 may be formed, for example, by following processes.

Second and third openings 310 and 315 may be formed through the insulation layer 220, the capping layer 290, and the first insulating interlayer 300 to expose the upper surfaces of the source/drain layers 210. A first metal layer may be formed on the exposed upper surfaces of the source/drain layers 210, sidewalls of the second and third openings 310 and 315, and the upper surface of the first insulating interlayer 300, and a heat treatment process may be performed thereon to form a first metal silicide pattern 320 on each of the source/drain layers 210.

A first barrier layer may be formed on the first metal silicide pattern 320, the sidewalls of the second and third openings 310 and 315, and the upper surface of the first insulating interlayer 300. A second metal layer may be formed on the first barrier layer to fill the second and third openings 310 and 315, and the second metal layer and the first barrier layer may be planarized until the upper surface of the first insulating interlayer 300 is exposed. Thus, the first and second contact plugs 332 and 334 may be formed on the first metal silicide pattern 320 to fill the second and third openings 310 and 315, respectively.

Each of the first and second contact plugs 332 and 334 may include a second metal pattern and a first barrier pattern covering a lower surface and a sidewall of the second metal pattern. Each of the first contact plugs 332 may extend in the second direction to a given length, and a plurality of first contact plugs 332 may be formed in the first direction. The second contact plug 334 may extend in the second direction to a given length, and a plurality of second contact plugs 334 may be formed in the first direction.

Figure 30:
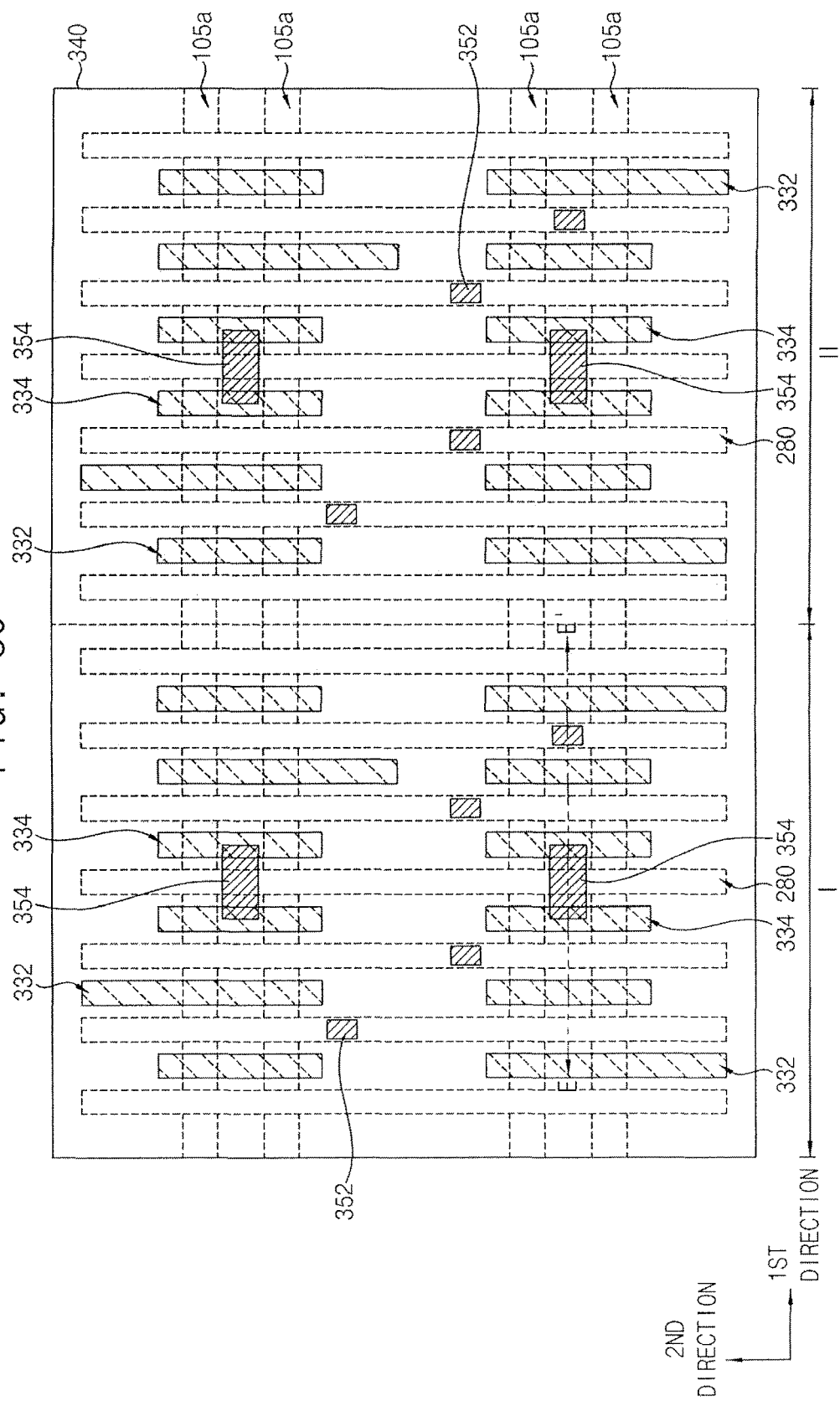
Figure 31:
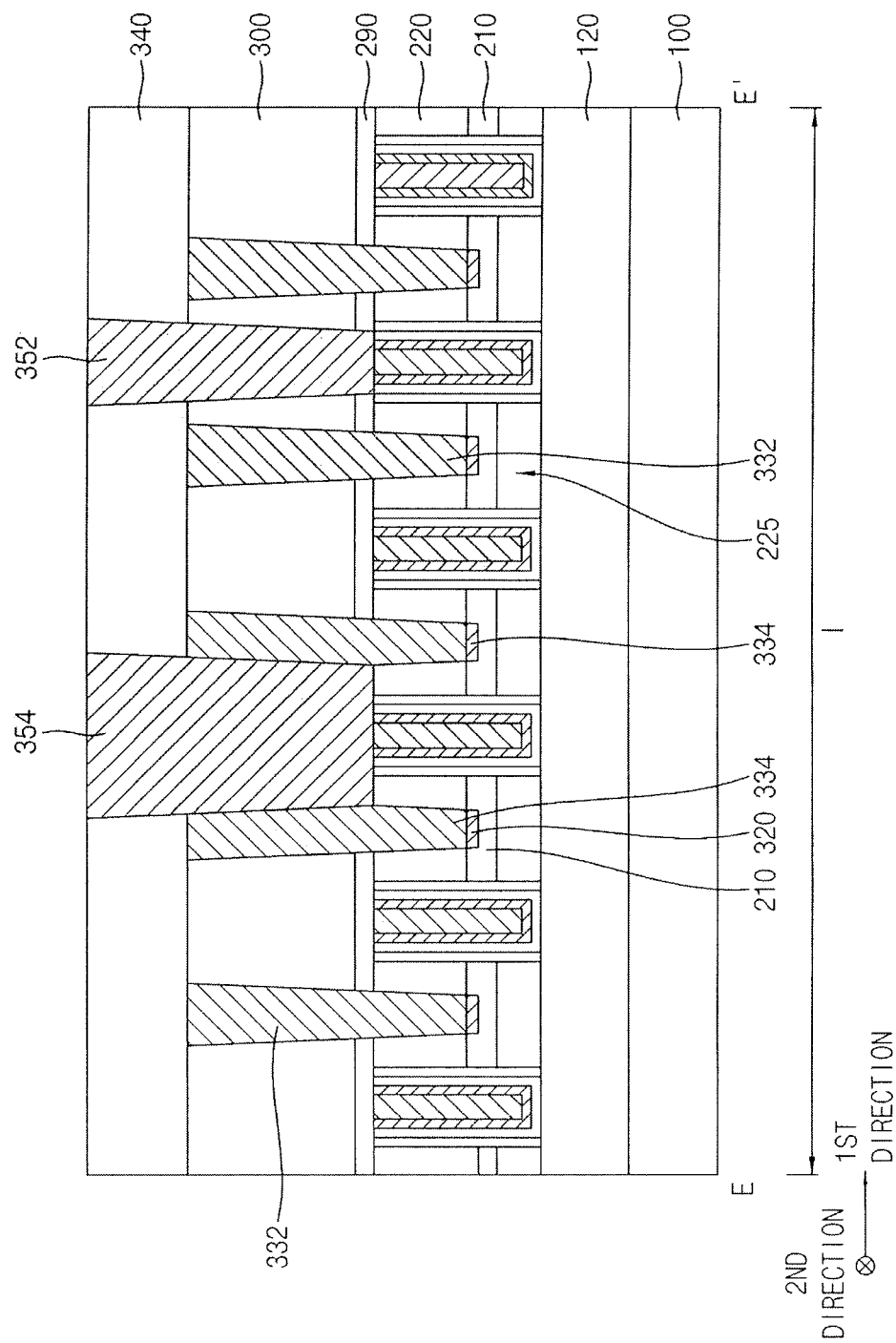

Referring to FIGS. 30 and 31, after a second insulating interlayer 340 is formed on the first insulating interlayer 300 and on the first and second contact plugs 332 and 334, a fourth opening exposing an upper surface of one of the gate structures 280 and extending through the second insulating interlayer 340, the first insulating interlayer 300, and the capping layer 290 may be formed. Next, a fifth opening exposing an upper surface of at least one of the gate structures 280 and extending through the second insulating interlayer 340, the first insulating interlayer 300, a portion of the second contact plug 334 and the capping layer may be formed. Third and fourth contact plugs 352 and 354 may be formed to fill the fourth and fifth openings, respectively.

In example embodiments, the fifth opening may also expose a portion of a sidewall of the second contact plug 334. For example, when two second contact plugs 334 are formed at respective opposite sides of the gate structure 280 adjacent to each other in the first direction, the fifth opening may expose each of opposite sidewalls of the respective two second contact plugs 334.

In an example embodiment, the third and fourth contact plugs 352 and 354 may be formed by forming a second barrier layer on bottoms and sidewalls of the fourth and fifth openings and an upper surface of the second insulating interlayer 340, forming a third metal layer on the second barrier layer to fill the fourth and fifth openings, and planarizing the third metal layer and the second barrier layer. Thus, each of the third and fourth contact plugs 352 and 354 may include a third metal pattern and a second barrier pattern covering a bottom and a sidewall of the third metal pattern.

Figure 32:
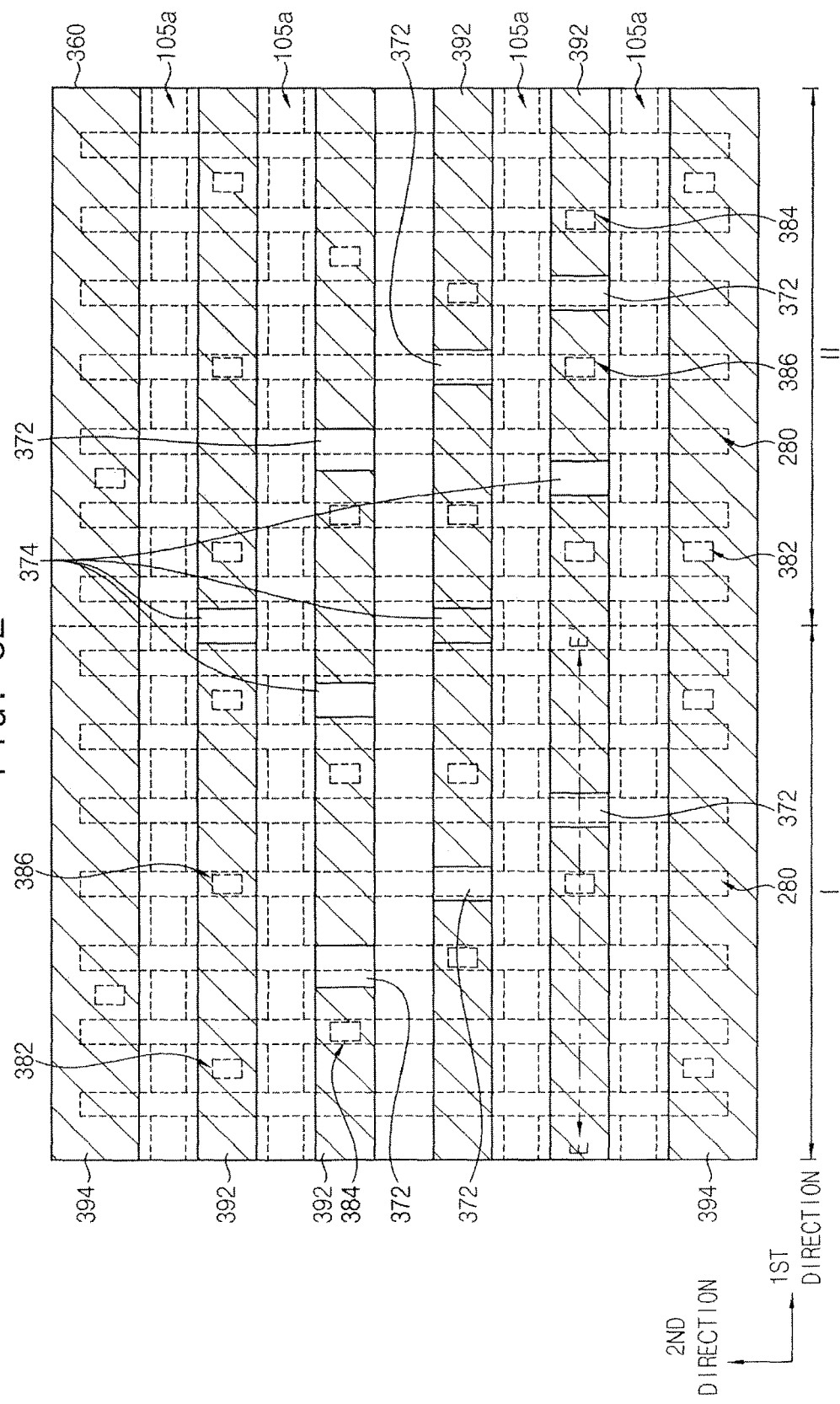
Figure 33:
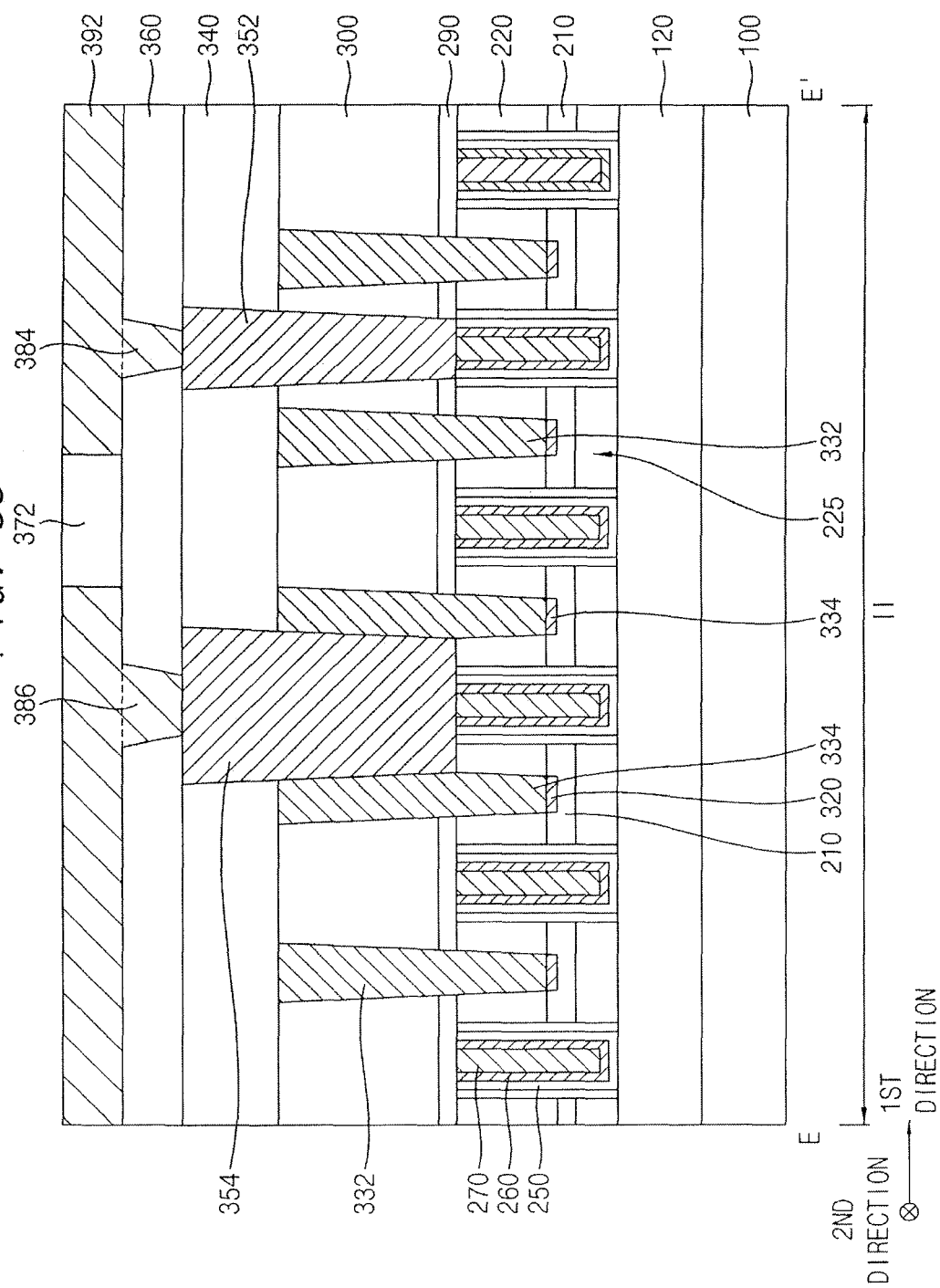
Figure 34:
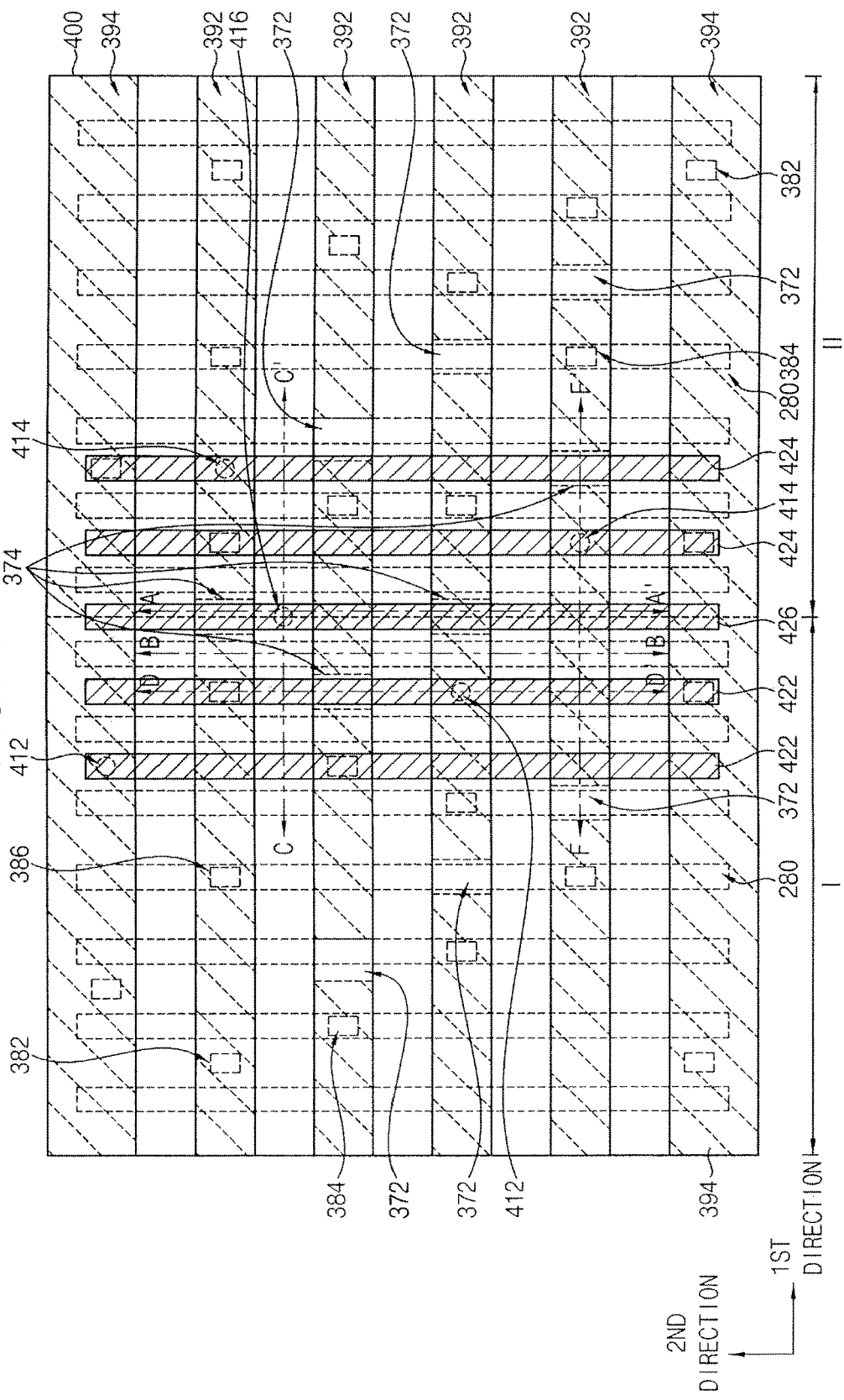
Figure 35:
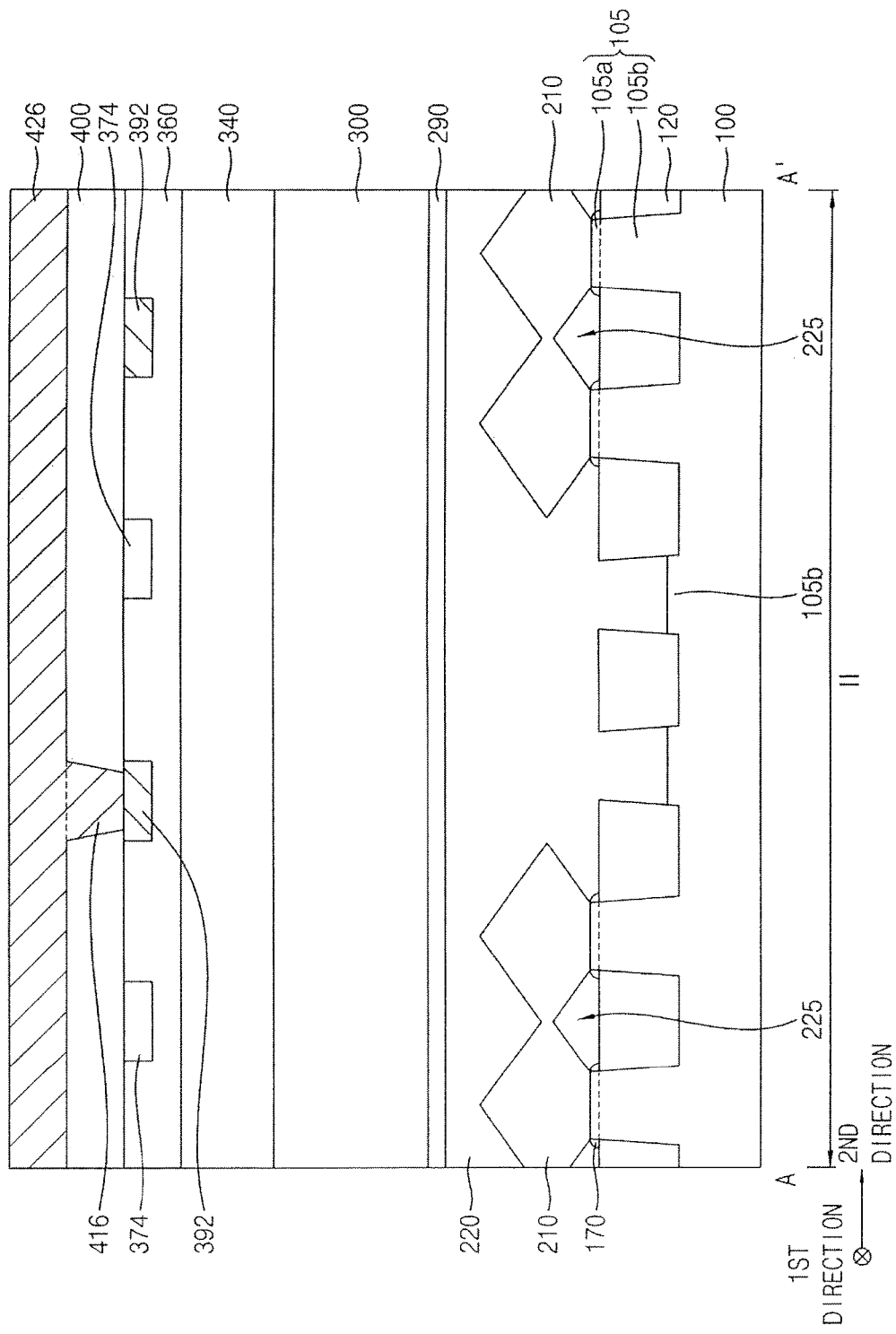

Referring to FIGS. 32 and 33, a third insulating interlayer 360 may be formed on the second insulating interlayer 340 and the third and fourth contact plugs 352 and 354. First and second conductive lines 392 and 394 extending through an upper portion of the third insulating interlayer 360, a first via 382 extending through a lower portion of the third insulating interlayer 360 and the second insulating interlayer 340, and second and third vias 384 and 386 extending through a lower portion of the third insulating interlayer 360 may be formed.

In example embodiments, the first and second conductive lines 392 and 394 and the first to third vias 382, 384 and 386 may be simultaneously formed by a dual damascene process. Thus, each of the first and second conductive lines 392 and 394 and each of the first to third vias 382, 384 and 386 may include a fourth metal pattern and a third barrier pattern covering a bottom and a sidewall of the fourth metal pattern. Alternatively, the first and second conductive lines 392 and 394 and the first to third vias 382, 384 and 386 may be independently formed by a single damascene process.

In example embodiments, each of the first to second conductive lines 392 and 394 may extend in the first direction, and a plurality of first conductive lines 392 and a plurality of second conductive lines 394 may be formed in the second direction. In example embodiments, the first via 382 may be formed under the first conductive line 392 or the second conductive line 394 and contact an upper surface of the first contact plug 332 or the second contact plug 334. The second via 384 may be formed under the first conductive line 392 or the second conductive line 394 and contact an upper surface of the third contact plug 352. The third via 386 may be formed under the first conductive line 392 or the second conductive line 394 and contact an upper surface of the fourth contact plug 354.

First and second insulation blocks 372 and 374 may be formed to replace portions of the first conductive line 392. In example embodiments, the first and second insulation blocks 372 and 374 may be formed by forming a mask on the third insulating interlayer 360 to partially expose the first conductive line 392, removing the exposed portion of the first conductive line 392 using the mask as an etching mask to form a sixth opening, forming an insulation layer to fill the sixth opening, and planarizing the insulation layer until an upper surface of the third insulating interlayer 360 is exposed. The insulation layer may include an oxide, e.g., silicon oxide.

In example embodiments, the first insulation block 372 may be formed on each of the first and second regions I and II, and the second insulation block 374 may be formed at positions of the second insulation block 34 illustrated with reference to FIGS. 3 to 8. Thus, a plurality of the second insulation blocks 374 may be formed at the boundary area between the first and second regions I and II or areas of the first and second regions I and II adjacent to the boundary area. The sixth opening for forming each of the second insulation blocks 374 may have a shape other than a bar extending in the second direction, e.g., a shape of a square, a rectangle, a circle, or an ellipse overlapping each of the First conductive lines 392. In example embodiments, the sixth openings exposing the respective first conductive lines 392 may have shapes and sizes substantially the same as each other, and thus the removed portions of the first conductive lines 392 may have substantially the same shape and size. As a result, even if the second insulation blocks 374 are formed in the first conductive lines 392, respectively, there is no distribution of electrical characteristics among the remaining first conductive lines 392.

After the first conductive line 392 is formed, a portion of the first conductive line 392 is replaced by the second insulation block 374. However, embodiments are not limited thereto. That is, it is possible to form the first and second insulation blocks 372 and 374 at desired positions on the third insulating interlayer 360, and to form the first and second conductive lines 392 and 394.

Referring to FIGS. 34 to 39, a fourth insulating interlayer 400 may be formed on the third insulating interlayer 360 and the first and second conductive lines 392 and 394, and third to fifth conductive lines 422, 424 and 426 extending through an upper portion of the fourth insulating interlayer 400 and fourth to sixth vias 412, 414 and 416 extending through a lower portion of the fourth insulating interlayer 400 may be formed.

In example embodiments, each of the third to fifth conductive lines 422, 424 and 426 may extend in the second direction, and a plurality of third conductive lines 422, a plurality of fourth conductive lines 424, and a plurality of fifth conductive lines 426 may be formed in the first direction. In example embodiments, the fifth conductive line 426 may be formed at a boundary area between the first and second regions I and II, and the third and fourth conductive lines 422 and 424 may be formed at areas of the first and second regions I and II adjacent to the boundary area.

In example embodiments, the fourth via 412 may be formed under the third conductive line 422 and contact an upper surface of the first conductive line 392 or the second conductive line 394. The fifth via 414 may be formed under the fourth conductive line 424 and contact an upper surface of the first conductive line 392 or the second conductive line 394. The sixth via 416 may be formed under the fifth conductive line 426 and contact an upper surface of the first conductive line 392 or the second conductive line 394.

In example embodiments, the fifth conductive line 426 at the boundary area between the first and second regions I and II may apply an electrical signal to the underlying first conductive line 392 or the second conductive line 394 through the sixth via 416. The fourth conductive line 424 on the second region II may apply an electrical signal to the underlying first conductive line 392 or a portion of the second conductive line 394 on the first region I through the fifth via 414. The third conductive line 422 may apply an electrical signal to the underlying first conductive line 392 or a portion of the second conductive line 394 on the second region II through the fourth via 412.

By the above processes, the semiconductor device may be manufactured. The above described method of designing the layout of the semiconductor device, the method of manufacturing the semiconductor device, and the semiconductor device may be applied to wiring structures of various types of memory devices, for example, logic devices, e.g., central processing units (CPUs), main processing units (MPUs), or application processors (APs), volatile memory devices, e.g., dynamic random-access memory (DRAM) devices or static random-access memory (SRAM) devices, or non-volatile memory devices, e.g., flash memory devices, phase change random-access memory (PRAM) devices, magnetoresisitve random-access memory (MRAM) devices, resistive random-access memory (RRAM) devices, or the like.

By way of summation and review, example embodiments provide a method of designing a layout of a semiconductor device including wiring structures having improved characteristics. Example embodiments also provide a method of manufacturing a semiconductor device including wiring structures having improved characteristics. Example embodiments also provide a semiconductor device including wiring structures having improved characteristics.

That is, in the method of designing a semiconductor device and the method of manufacturing the semiconductor device in accordance with example embodiments, a plurality of insulation blocks with constant shape and size for cutting the lowermost conductive lines may be spread at the boundary area and areas of the cells adjacent the boundary area. Thus, the process for forming the insulation blocks may not have limitations, the insulation blocks cutting the wirings may have a constant shape, and there may be no electrical characteristics distribution of the lowermost conductive lines.

Additionally, the electrical signals may be applied to neighboring cells through the lowermost conductive lines. That is, the electrical connection between wirings in neighboring cells may not be completely blocked by the insulation blocks, and a wiring in a region of one cell may be used as a routing wiring of a regions of another cell adjacent thereto.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. A method of manufacturing a semiconductor device, the method comprising:
  forming layouts of cells on a substrate, each layout of the layouts of the cells including first conductive lines on the substrate, the first conductive lines extending in a first direction and being spaced apart from each other in a second direction crossing the first direction;
  arranging the layouts of the cells to be adjacent to each other in the first direction, such that the first conductive lines in one layout of the layouts of the cells are collinear with the first conductive lines in an adjacent layout of the layouts of cells, respectively; and
  forming insulation blocks at a boundary area between adjacent ones of the layouts of the cells or in areas of the layouts of the cells adjacent to the boundary area, such that at least one insulation block is between two collinear first conductive lines of the first conductive lines that are on the adjacent cells.

2. The method as claimed in claim 1, wherein the insulation blocks are spaced apart from each other.

3. The method as claimed in claim 1, wherein at least one of the insulation blocks is disposed in an area of each of the cells adjacent to the boundary area.

4. The method as claimed in claim 1, wherein neighboring ones of the insulation blocks do not overlap each other in the second direction.

5. The method as claimed in claim 1, wherein the at least one insulation block of the insulation blocks is in direct contact with each of the two collinear first conductive lines of the first conductive lines that are on the adjacent cells.

6. The method as claimed in claim 1, wherein at least one of the insulation blocks has a length in the first direction different from those of other ones of the insulation blocks.

7. The method as claimed in claim 1, further comprising:
    disposing second conductive lines in the first direction, each of the second conductive lines extending in the second direction, and the second conductive lines being disposed in areas of the cells and at the boundary area between the cells; and
    disposing first vias, each via commonly overlapping one of the first conductive lines and one of the second conductive lines in a plan view.

8. The method as claimed in claim 7, wherein at least one of the first vias overlaps the boundary area between the cells.

9. The method as claimed in claim 7, wherein the cells include first and second cells adjacent to each other, at least one of the second conductive lines disposed in an area of the second cell is connected to a portion of one of the first conductive lines in an area of the first cell through one of the first vias.

10. The method as claimed in claim 1, wherein each of the cells further includes:
    gate lines disposed in the first direction, each of the gate lines extending in the second direction;
    first contact plugs between the gate lines;
    a second via overlapping at least one of the first contact plugs in a plan view; and
    a third via overlapping at least one of the gate lines in a plan view.

11. A method of manufacturing a semiconductor device, the method comprising:
    forming cells in a first direction such that first conductive lines in the respective cells are collinear with each other, the first conductive lines being spaced apart from each other in a second direction substantially perpendicular to the first direction in each of the cells, and each of the first conductive lines extending in the first direction;
    forming insulation blocks at a boundary area between the cells or in areas of the cells adjacent to the boundary area, such that at least one of the insulation blocks is between two collinear first conductive lines of adjacent cells, the at least one of the insulation blocks partially overlapping each of the first conductive lines in the first direction;
    forming second conductive lines spaced apart in the first direction in each of the cells, each of the second conductive lines extending in the second direction; and
    forming first vias each commonly overlapping one of the first conductive lines and one of the second conductive lines in a plan view.

12. The method as claimed in claim 11, wherein one of the second conductive lines is disposed at the boundary area between the cells.

13. The method as claimed in claim 12, wherein at least one of the first vias overlaps the boundary area between the cells.

14. The method as claimed in claim 11, wherein at least one of the insulation blocks is disposed in each of the areas of the cells adjacent the boundary area.

15. The method as claimed in claim 11, wherein neighboring ones of the insulation blocks do not overlap each other in the second direction.

16. The method as claimed in claim 11, wherein the cells include first and second cells adjacent to each other,
    and wherein at least one of the second conductive lines in an area of the second cell is connected to a portion of one of the first conductive lines in an area of the first cell through one of the first vias.

17. A method of manufacturing a semiconductor device, the method comprising:
    forming first conductive lines spaced apart from each other in a second direction on a substrate including cell regions, each of the first conductive lines extending in a first direction crossing the second direction;
    forming insulation blocks at a boundary area between the cell regions in the first direction or areas of the cell regions adjacent the boundary area, portions of the first conductive lines being replaced by the insulating blocks, respectively; and
    forming second conductive lines in the first direction, each of the second conductive lines extending in the second direction on the first conductive lines in each of the cell regions and being electrically connected to each of the first conductive lines through underlying first vias.

18. The method as claimed in claim 17, wherein the insulation blocks are spaced apart from each other.

19. The method as claimed in claim 17, wherein at least one of the insulation blocks is formed in each of the areas of the cell regions adjacent the boundary area between the cell regions.

20. The method as claimed in claim 17, wherein neighboring ones of the insulation blocks do not overlap each other in the second direction.

* * * * *